(12) United States Patent
Chu

(10) Patent No.: US 7,091,095 B2
(45) Date of Patent: Aug. 15, 2006

(54) DUAL STRAIN-STATE SIGE LAYERS FOR MICROELECTRONICS

(75) Inventor: Jack Oon Chu, Manhasset, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/053,707

(22) Filed: Feb. 8, 2005

(65) Prior Publication Data

US 2005/0156268 A1 Jul. 21, 2005

Related U.S. Application Data

(62) Division of application No. 10/389,145, filed on Mar. 15, 2003, now Pat. No. 6,963,078.

(51) Int. Cl.
  *H01L 21/336* (2006.01)

(52) U.S. Cl. .................. 438/287; 438/285; 438/481

(58) Field of Classification Search .............. 438/46, 438/47, 285, 287, 479, 481, 761, 762, 763, 438/779, 933
See application file for complete search history.

(56) References Cited

U.S. PATENT DOCUMENTS

| | | | | |
|---|---|---|---|---|
| 5,847,419 A | * | 12/1998 | Imai et al. | 257/192 |
| 6,399,970 B1 | * | 6/2002 | Kubo et al. | 257/194 |
| 6,633,066 B1 | * | 10/2003 | Bae et al. | 257/347 |
| 6,703,688 B1 | * | 3/2004 | Fitzergald | 438/288 |
| 6,774,015 B1 | * | 8/2004 | Cohen et al. | 438/479 |
| 6,830,976 B1 | * | 12/2004 | Fitzgerald | 438/287 |
| 6,855,649 B1 | * | 2/2005 | Christiansen et al. | 438/311 |
| 2003/0077867 A1 | * | 4/2003 | Fitzgerald | 438/285 |
| 2005/0202640 A1 | * | 9/2005 | Fitzgerald | 438/287 |

* cited by examiner

*Primary Examiner*—Kevin M. Picardat
(74) *Attorney, Agent, or Firm*—George Sai-Halasz; Robert M. Trepp

(57) ABSTRACT

A strained crystalline layer having a tensilely strained SiGe portion and a compressively strained SiGe portion is disclosed. The strained crystalline layer is epitaxially bonded, or grown, on top of a SiGe relaxed buffer layer, in a way that the tensilely strained SiGe has a Ge concentration below that of the SiGe relaxed buffer, and the compressively strained SiGe has a Ge concentration above that of the SiGe relaxed buffer. The strained crystalline layer and the relaxed buffer can reside on top a semi-insulator substrate or on top of an insulating divider layer. In some embodiments the tensile SiGe layer is pure Si, and the compressive SiGe layer is pure Ge. The tensilely strained SiGe layer is suited for hosting electron conduction type devices and the compressively strained SiGe is suited for hosting hole conduction type devices. The strained crystalline layer is capable to seed an epitaxial insulator, or a compound semiconductor layer.

33 Claims, 12 Drawing Sheets

DUAL STRAIN-STATE SIGE LAYERS FOR MICROELECTRONICS

CROSS REFERENCE TO A RELATED APPLICATION

This application is a division of application Ser. No. 10/389,145, filed Mar. 15, 2003 now U.S. Pat. No. 6,963,078, which is incorporated herein by reference.

FIELD OF THE INVENTION

The present invention relates to strained crystalline semiconductor layers in the field of microelectronics. In particular it teaches the combination of tensilely and compressively strained SiGe regions in the same thin layer, having enhanced carrier mobilities for both electrons and holes. The invention also relates to these strained layers on top of a scalable insulating divider layer, which is optimized for parasitic capacitance and thermal heating resulting in high speed and low noise device operations. The invention further teaches devices hosted in these layers, which can operate from 400° K to 5° K, and teaches processors functioning with such devices. The invention also relates to methods of fabricating such strained SiGe layers and the devices therein.

BACKGROUND OF THE INVENTION

Today's integrated circuits include a vast number of devices housed in a semiconductor. Smaller devices are the key to enhance performance and to increase reliability. As devices are scaled down, however, the technology becomes more complex and new methods are needed to maintain the expected performance enhancement from one generation of devices to the next. In this regard the semiconductor that has progressed the farthest is the primary semiconducting material of microelectronics, silicon (Si), or more broadly, to Si based materials. Such a Si based material of importance for microelectronics is the silicon-germanium (SiGe) alloy.

One of the most important indicators of potential device performance is the carrier mobility. There is great difficulty in keeping carrier mobility high in devices of deeply submicron generations. A promising avenue toward better carrier mobility is to modify slightly the semiconductor that serves as raw material for device fabrication. It has been known, and recently further studied, that tensilely or compressively straining semiconductors have intriguing carrier properties. A Si layer embedded in a Si/SiGe heterostructure grown by UHV-CVD has demonstrated enhanced transport properties, namely carrier mobilities, over bulk Si. In particular, a 90–95% improvement in the electron mobility has been achieved in a strained Si channel NMOS in comparison to a bulk Si NMOS mobility. (NMOS stand for N-channel Metal Oxide Semiconductor transistor, a name with historic connotations for Si Field-Effect-Transistors (FET). PMOS stands for P-channel Metal Oxide Semiconductor transistor).

Germanium (Ge) has attractive hole carrier properties. It is for this reason that the SiGe alloy is an advantageous material for hole conduction type devices. The band structures of Si and Ge, and of the SiGe alloy, as well, are such that the hole transport, primarily hole mobility, improves if the materials are under compressive strain.

Ideally, one would like to have integrated circuit such that the electron conduction type devices, such as NMOS, NMODFET are hosted in a strained Si or SiGe material, while the hole conduction type devices, such as PMOS, PMODFET are hosted in a compressed Ge or SiGe material. NMODFET stands of N-Modulation Doped FET. (PMOS and PMODFET stand for the corresponding P type devices.) The term of hosting a device in a certain material, or layer, means that the critical part of the device, that which is mainly sensitive to carrier properties, such as, for instance, the channel of MOS devices, is residing in, composed of, housed in, that certain material, or layer.

The great difficulty lies in producing materials of tensilely strained Si, or SiGe, together with compressively strained SiGe, or Ge, that are of high enough crystalline quality, namely practically free of dislocations and other defects, that can satisfy the exceeding demands of microelectronics applications. Such crystalline material quality is usually referred to as microelectronics quality. For defects, microelectronics quality means a density below about $10^5/cm^2$. Fabricating tensilely or compressively strained microelectronics quality SiGe layers by themselves is exceedingly difficult, but having them side by side in the same crystalline layer, ready to host the respective devices adds even more complications.

If one achieves a materials of sufficiently good quality, with high carrier mobilities in the of form thin layers, the underlying substrate may be a source of defects that eventually find their way into the good quality material on the surface as a result of device fabrication or integration. An additional potential area of concern is the interaction of a semiconducting substrate with active devices on the surface. The underlying semiconducting substrate may introduce features which could limit the harvesting of the full advantage that a superior strained device layer can bestow. Often today's state of the art devices operate in a semiconducting layer which is separated from the semiconducting substrate by an insulating layer. This technology is commonly knows as SOI technology. (SOI stands for Si-on-insulator.) The standard method of producing SOI materials is called the SIMOX process. It involves the implantation of very high doses of oxygen ions at high energy into the semiconductor, and upon annealing, the oxygen forms an oxide layer under the surface of the semiconductor. In this manner one has a top semiconductor layer separated from the bulk of the substrate. However, the SIMOX process has many of its own problems that makes it unsuitable for the production of high mobility strained layers.

SUMMARY OF THE INVENTION

In accordance with the objectives listed above, the present invention describes a system and method for a crystalline layer having a tensilely strained SiGe portion and a compressively strained SiGe portion. Both portions of the crystalline layer can be epitaxially grown or bonded on top of a SiGe relaxed buffer. The strains in the two portions are induced by epitaxially growing the tensilely strained SiGe with a Ge concentration which is less than the Ge concentration in the SiGe relaxed buffer, and epitaxially growing the compressively strained SiGe with a Ge concentration which is higher than the Ge concentration in the SiGe relaxed buffer. Consequently, the compressively strained SiGe always has a higher Ge concentration than the tensilely strained SiGe. The present invention further describes steps in the fabrication of the SiGe relaxed buffer; how to utilize the relaxed buffer on top a support structure; performing a layer transfer to another substrate, or to another substrate with an insulating layer between the substrate and the SiGe relaxed buffer.

There are numerous patents and publication relating to this subject. They cover some aspects of strained layer semiconductors, and some aspects of layer transfers and also elements of creating strained layers over insulators. But none teaches the present invention.

For example, U.S. Pat. No. 5,461,243 to B. A. Ek et al, titled: "Substrate for Tensilely Strained Semiconductor" teaches the straining of one layer with another one grown on top of it, and sliding the bottom very thin Si layer on an $SiO_2$ layer. But this patent does not teach the present invention.

In U.S. Pat. No. 5,906,951 to J. Chu and K. Ismail, titled "Strained Si/SiGe layers on Insulator" incorporated herein by reference, there are a variety of layers deposited to yield two stacked non-planar strained channels. However this patent again does not teach the present invention.

US patent application "Preparation of Strained Si/SiGe on Insulator by Hydrogen Induced Layer Transfer Technique" by D. Canaperi et al, filed Sep. 29, 2000, Ser. No. 09/675,840, incorporated herein by reference, teaches strain layer deposition and Hydrogen induced layer transfer (SmartCut), but it does not teach the present invention.

Formation of graded SiGe layers can proceed as described in U.S. Pat. No. 5,659,187 to LeGoues et al. titled: "Low Defect Density/arbitrary Lattice Constant Heteroepitaxial Layers" incorporated herein by reference.

Fabrication of a tensilely strained SiGe layer is taught in US patent application titled: "Strained Si based layer made by UHV-CVD, and Devices Therein", by J. Chu et al, filed Feb. 11, 2002, Ser. No. 10/073,562, incorporated herein by reference, but this application does not teach the present invention.

The following patent and applications bear reference to both semiconductor strain layer formation and layer transfer. US patent application "A Method of Wafer Smoothing for Bonding Using Chemo-Mechanical Polishing (CMP)" by D. F. Canaperi et al., Ser. No. 09/675,841 filed Sep. 29, 2000, incorporated herein by reference, describes surface polishing to reduce surface roughness in preparation to wafer bonding. Atomic level etching and smoothing of material surfaces by Gas Cluster Ion Beam (GCIB) processing, a patented technique from Epion Corporation is incorporated herein by reference further provides a corrective method for achieving complete wafer uniformity down to ultra-thin thickness, less than 10 nm, and surface roughness down to less than 0.5 nm. US patent application "Layer Transfer of Low Defect SiGe Using an Etch-back Process" by J. O. Chu, et al, Ser. No. 09/692,606 filed Oct. 19, 2000, incorporated herein by reference, describes methods to create relaxed SiGe layers and to use an etch-back process for layer transfer. U.S. Pat. No. 5,963,817 to J. Chu et al, titled "Bulk and Strained Silicon on Insulator Using Local Selective Oxidation" incorporated herein by reference, teaches using local selective oxidation in a layer transfer process.

A typical embodiment of the present invention starts with a standard Si substrate, or wafer. In some cases this Si substrate can have preparatory steps already performed on it for facilitating a layer transfer process to be performed after the layer deposition steps. Such a preparatory step can be, for instance, the creation of a porous layer in connection with the so called ELTRAN (Epitaxial Layer TRANsfer, a registered trademark of Canon K.K.) process. Next, a stepgraded SiGe layer is epitaxially deposited, followed by epitaxy on top of the step graded layer by the first part of the SiGe relaxed buffer layer. The step graded layer, or in alternate embodiments a linearly graded SiGe layer, are supporting a layer which ultimately will be the relaxed buffer. Accordingly, any of the layers needed for fabricating the SiGe relaxed buffer will be referred to as a support structure. These fabrication steps are detailed in the incorporated U.S. patent application Ser. No. 10/073,562, by the present inventor. Next, the first SiGe layer is polished using Chemical Mechanical Polishing (CMP), ion milling. Gas Cluster Ion Beam (GCIB) to a degree of surface roughness (RMS <0.5 nm) suitable for microelectronics applications. The polishing of SiGe layers is detailed in the incorporated U.S. patent application Ser. No. 09/675,841, by D. Canaperi et al. In the following step, a very thin layer of Si is epitaxially grown on the smooth surface of the SiGe layer, which than is followed with epitaxy of the second part of the SiGe relaxed buffer onto which the strained device layers can be grown.

At this point a layer transfer step is performed. Transferring layers to a second substrate, typically Si, is well know in the art. The reasons and advantages for having the device layers on a new substrate are presented in the incorporated U.S. patent application Ser. No. 10/073,562 by the present inventor. There are several techniques to execute the layer transfer. A preferred process is the so called SmartCut (SmartCut is a registered trademark of SOITEC Corporation) as described in the incorporated U.S. patent application Ser. No. 09/675,840, by D. Canaperi et al. In a preferred embodiment an insulating divider layer is interposed between the semiconducting new substrate and the transferred layers. In the SmartCut process the cut is made just below the thin Si layer, accordingly the second part of the SiGe relaxed buffer layer, the thin Si layer, and a part of the underlying first part of the SiGe relaxed buffer layer is being transferred. Due to the transfer step now this originally underlying first part of the SiGe relaxed buffer layer is on the surface, with the thin Si layer underneath, and the originally on top second part of the SiGe relaxed buffer layer being on the bottom, making contact with the insulating divider layer, or in an alternate embodiment with the new substrate itself. In a variation of a preferred embodiment a thin crystalline second $SiO_2$ layer may be grown onto the relaxed buffer layer. This crystalline second $SiO_2$ layer facilitates the bonding process in promoting good adhesion during layer transfer. The remainder of the first SiGe layer is etched away with a first selective etch, employing the thin Si layer as an etch stop. Suitable enchants that dissolve SiGe but stop on pure Si are for instance, a 1:2:3 solution of $HF:H_2O_2$:AceticAcid, $NH_4OH:H_2O_2$:AceticAcid, or $NH_4OH:H_2O_2$:$H_2O$. If the remainder of the first SiGe layer after transfer is relatively thick, a grinding or etching step may precede the selective etching step. Alternatively, a low temperature oxidation (<700 C) such as High Pressure Oxidation (HIPOX) can be employed to selectively oxidize the SiGe layer and then be removed using the standard silicon dioxide etch of BOE and DHF. Next, one etches away the thin Si layer with a second selective etch, using the second part of the SiGe relaxed buffer layer as an etch stop. A suitable etchent that dissolves Si but stops on SiGe is for instance, a solution of EPPW, KOH or TMAH. After having etched away the thin Si layer, the second part of the SiGe relaxed buffer layer becomes exposed. This layer is now available to serve as the layer upon which the microelectronically important strained layers can be deposited.

In one embodiment a SiGe layer with a Ge concentration below that of the Ge concentration in the SiGe relaxed buffer is epitaxially deposited over the whole surface of the SiGe relaxed buffer. Since in this crystalline layer the Ge concentration, which can be zero, is less than that of the SiGe relaxed buffer, the crystalline layer will be tensilely strained. Lower Ge concentration gives this crystalline layer a smaller lattice constant in the bulk (relaxed state) than the lattice constant of the SiGe relaxed buffer. Since the epitaxy forces the two lattice constants to match, the crystalline microelectronics layer will have its lattice constant stretched in the plane of the layer. This stretching gives the tensile strain in the plane of the layer. Next, this tensilely strained crystalline SiGe layer is completely removed in those portions of the layer where the need is for a compressively strained SiGe layer. Such removal operations are know in the art, for instance, by masking with photoresist and using reactive ion etching (RIE). Finally a compressively strained SiGe layer is epitaxially deposited to the portion of the layer which is without masking, again onto the reexposed SiGe relaxed buffer. Since in this second crystalline layer the Ge concentration is above that of the SiGe relaxed buffer, the crystalline layer will be compressively strained. Higher Ge concentration gives this second crystalline layer a larger lattice constant in the bulk (relaxed state) than the lattice constant of the SiGe relaxed buffer. Since the epitaxy forces the two lattice constants to match, the crystalline microelectronics layer will have its lattice constant compressed in the plane of the layer. This compression gives the compressive strain in the plane of the layer. After this second epitaxy step the crystalline layer having a tensilely strained SiGe portion and a compressively strained SiGe portion is ready, and the compressively strained SiGe has a higher Ge concentration than the tensilely strained SiGe. In this embodiment the portion of the compressively strained SiGe layer is occupying essentially a plurality of island regions, surrounded by the tensilely strained SiGe crystalline layer. Follow up precessing steps will be used to build high performance n-type devices in the tensile SiGe layer and p-type devices in the compressive SiGe layer.

In an alternate embodiment the order in which the two crystalline layers are deposited is reversed. First the higher Ge concentration layer is uniformly grown onto the SiGe relaxed buffer. Portions of this layer are subsequently removed, and in the removed portions a low Ge concentration SiGe layer is epitaxially grown, giving the tensilely strained crystalline SiGe layer. After this second epitaxy step the crystalline layer having a compressively strained SiGe portion and a tensilely strained SiGe portion is ready, and the compressively strained SiGe has a higher Ge concentration than the tensilely strained SiGe. In this embodiment the portion of the tensilely strained SiGe layer is occupying essentially a plurality of island regions, surrounded by the compressively strained SiGe crystalline layer. Follow up precessing steps will be used to build high performance n-type devices in the tensile SiGe layer and p-type devices in the compressive SiGe layer.

Independently whether the tensilely strained, or the compressively strained layer is grown first in blanket fashion, there are several variations possible in the embodiments.

It may be desirable for further device processing, and it can also help with regrowth of the crystalline layers, if one is building an isolating trench separating the compressively strained SiGe portion and the tensilely strained SiGe portion. The process is to fabricate an isolation dielectric strip, or trench, along the sidewall of one of the strained crystalline layers before the other crystalline layer is selectively deposited.

Additionally, when the second crystalline layer is being epitaxially deposited into the openings created in the first crystalline layer, the actual crystalline layer growth may be preceded first by the growth of a very thin epitaxial SiGe seed layer of different composition than the actual strained crystalline layer to follow.

In the embodiment where layer transfer occurs onto an insulating divider layer, resulting in, as commonly known, an SOI structure, the devices and circuits built into the strained layers take advantage of all the known benefits of SOI, relative to devices built onto a bulk substrate. However, there also some disadvantages of SOI technology known in the arts. One such disadvantage is the so called electrical bouncing of devices, or floating body problems, due to a lack of good common ground plane, such as the substrate in case of devices fabricated over bulk. Another disadvantage is the self-heating effects and problems associated with SGOI (Silicon Germanium On Insulator) structures leading to poor circuit performance, due to the poor thermal conductivity of SiGe and $SiO_2$ materials with respect to silicon. The present invention has in a preferred embodiment a solution for this problem. A conducting ground plane, or layer, can be prefabricated into the insulating divider layer before the layer transfer takes place. Similarly, this conducting layer or portions thereof may serve as a thermal conductor to dissipate heat or cool the SiGe layer or the entire SGOI substrate for low temperature operations. This conducting layer, included in the insulating divider layer, may be a blanket layer, or patterned to conform ahead of time to the needs of the devices which will be fabricated later in the crystalline strained layers. There is capability also form more than one plane of such conducting layers. This conducting layer inside the insulating divider layer can reach the outside of the insulating divider layer with the use of standard vias. Fabrication of such conducting layers inside insulating layers is known in the arts, most commonly in the technology of multilevel wiring, or metallization, that almost all present day electronics chips are in need of.

As described so far, the strained crystalline SiGe layers have a set composition. In some embodiments this is not exclusively followed. Especially for the compressively strained layers where the Ge concentration needs to be higher, the Ge concentration may be varied during the growth of the layer. The final layer has a nonuniform, or graded Ge concentration, typically increasing toward the surface. This grading facilitates the growth of relatively high concentration Ge layers, which consequently are highly compressed. The critical operations of state of the art devices, especially those of NMOS and PMOS devices, are concentrated to an extremely thin layer on the surface. Consequently, for device operation what really only matters is the strain on the layer surface, and grading of Ge concentration can be well tolerated.

Most of the microelectronics layers, such as the strained layers, or the seed layers, in some embodiments may have incorporated up to about 1% of carbon (C). Carbon in such concentrations improves on the quality of these materials, mainly by reducing defect densities.

High performance is associated with strained device layers, and SOI technology, and also with low temperature operation. Low temperature means below about 250° K, down to around 70° K, which is already below the liquid-nitrogen one-atmosphere boiling point. Device performance (for MOS type devices) improves with any decrease in temperature. However, to get significant improvement over room temperature operation one must go down to at least 250° K. On the other hand, to go below 70° K is not practical, and device performance is not much, if at all, improving at even lower temperatures. To obtain the optimal performance of devices at low temperatures they have to be device-designed already for low temperature operation. Such device-designs, optimized for low temperature operation, are well known in the previous art. This invention, by combining the device-designs for operation in the 250° K. to 70° K range with the SOI technology and with the both tensilely and compressively strained device layers, aims at devices and processors of the utmost performance.

Accordingly, it is an object of the present invention to have a high quality crystalline layer having a tensilely strained SiGe portion and a compressively strained SiGe portion.

It is a further object of the present invention to teach methods for fabricating the crystalline layer having a tensilely strained SiGe portion and a compressively strained SiGe portion.

It is a further object of the present invention to have devices fabricated in the compressively strained SiGe and tensilely strained SiGe layers. Preferably electron conduction type devices in the tensilely strained SiGe layers and hole conduction type devices in the compressively strained SiGe layers.

It is yet another object of the present invention to have optical devices fabricated in the compressively strained SiGe and tensilely strained SiGe layers.

It is a further object of the present invention to have further epitaxial layers deposited onto the crystalline layer having a tensilely strained SiGe portion and a compressively strained SiGe portion, such as a thin crystalline insulator layer, or layers of compound semiconductors, wherein the epitaxial compound semiconductors are optimized in regard to their optical device capabilities.

It is yet another object of the present invention to have digital circuits fabricated in the compressively strained SiGe and tensilely strained SiGe layers.

It is a further object of the present invention to have analog circuits fabricated in the compressively strained SiGe and tensilely strained SiGe layers.

It is a further object of the present invention to have mixed analog circuits fabricated in the compressively strained SiGe and tensilely strained SiGe layers.

It is a further object of the present invention to have high performance processors comprising at least one chip, where the chip has a crystalline layer having a tensilely strained SiGe portion and a compressively strained SiGe portion, hosting devices which devices are wired according to the design of the processor.

BRIEF DESCRIPTION OF THE DRAWINGS

These and other features of the present invention will become apparent from the accompanying detailed description and drawings, wherein.

DETAILED DESCRIPTION OF THE INVENTION

Figure 1A:
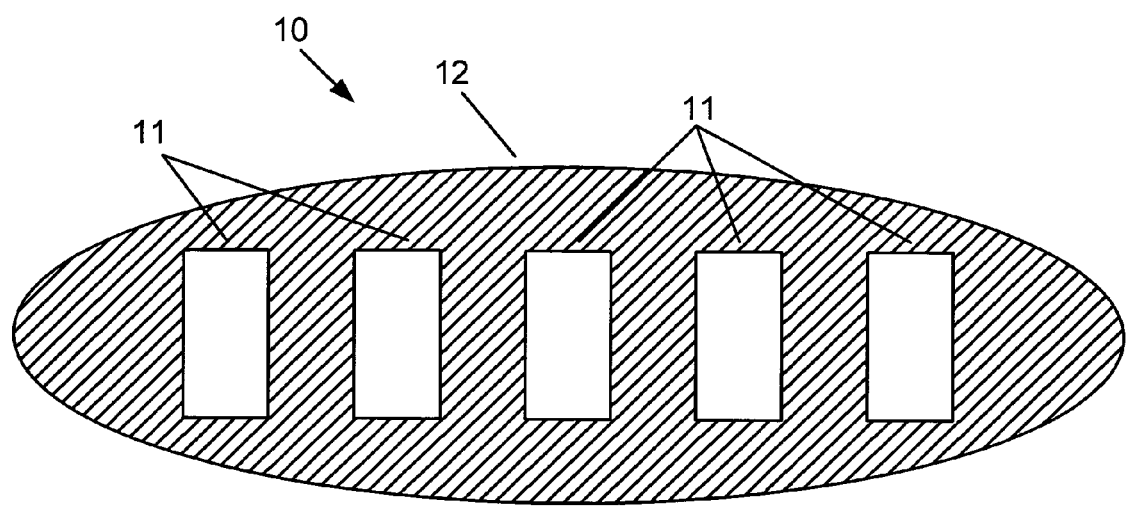
FIG. 1 Shows a top view of crystalline layers having a tensilely strained SiGe portion and a compressively strained SiGe portion.
Figure 1B:
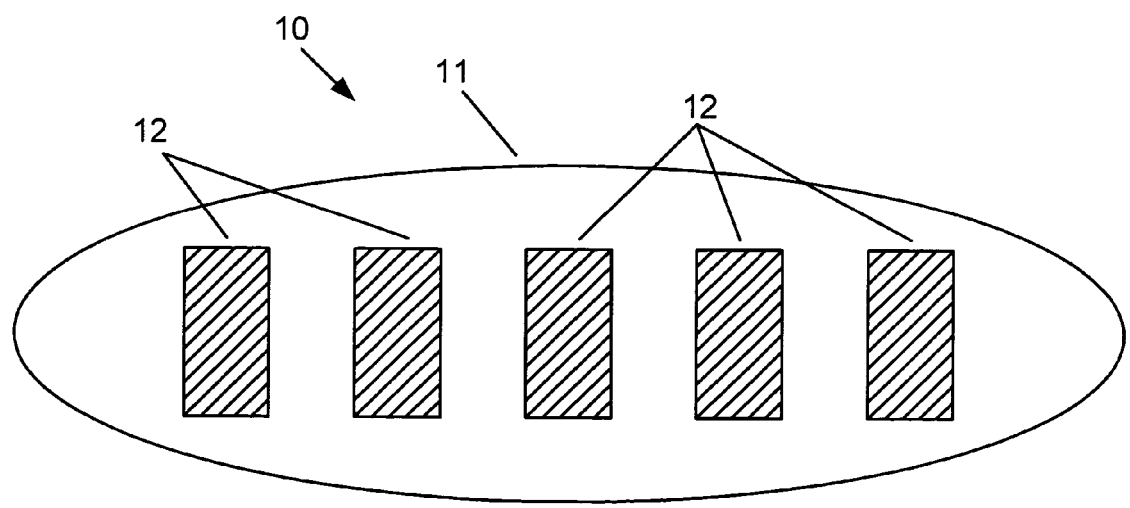

FIG. 1 shows a top view of crystalline layers 10 having a tensilely strained SiGe portion and a compressively strained SiGe portion. FIG. 1A shows an embodiment, 10, where the compressively strained SiGe portion 11 occupies essentially a plurality of island regions in a tensilely strained SiGe portion 12. This configuration is typically the result of the fabrication method where a uniformly deposited tensilely strained SiGe is opened up and the compressively strained SiGe is then grown in the openings. FIG. 1B shows an alternate preferred embodiment of the strained crystalline layer 10 where the tensilely strained SiGe portion 12 occupies essentially a plurality of island regions in a compressively strained SiGe portion 11. The configuration of FIG. 1B is typically the result of the fabrication method where a uniformly deposited compressively strained SiGe is opened up and the tensilely strained SiGe is then grown in the openings. It is always true that the compressively strained SiGe 11 has a higher Ge concentration than the tensilely strained SiGe 12. The difference on the strain-state, tensile or compressive, if the two portions is due to the difference in their Ge concentration. Higher Ge concentration leads to larger relaxed state lattice constant.

The composition of the strained crystalline layers is determined by the actual application needs, as one skilled in art would recognize. However this composition is bound by certain general considerations. Since the tensilely strained SiGe portion 12 has the purpose of hosting electron type devices, the tensile strain being particularly advantageous for electron transport, the Ge concentration is relatively low, not exceeding 15%. In a preferred embodiment the tensilely strained SiGe layer is a pure Si layer, with essentially 0% of Ge concentration. The compressively strained SiGe 11 has the purpose of hosting hole type devices where Ge has the advantage in electrical transport properties. Consequently, the compressively strained SiGe layer has at most 70% Si content. In a preferred embodiment the compressively strained SiGe layer is a pure Ge layer, with essentially 0% of Si concentration. Either, or both, of the tensilely strained and compressively strained portions may contain up to 1% of C, chiefly for improving material quality.

Figure 2A:
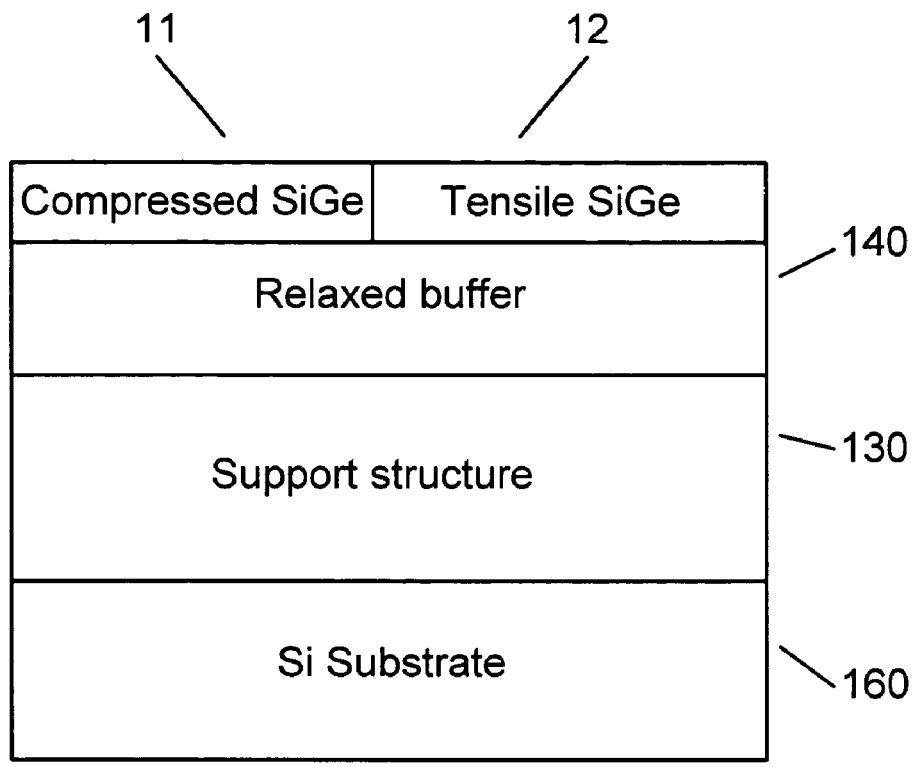
FIG. 2 Shows a cross sectional view of layered structures comprising the crystalline layer having a tensilely strained SiGe portion and a compressively strained SiGe portion.

FIG. 2 shows a cross sectional view of layered structures comprising the strained crystalline layer having a tensilely strained SiGe portion and a compressively strained SiGe portion, or the strained crystalline layer, for short. Parts A, B, and C of the figure show differing embodiments of a layered structure which contains the strained crystalline layer. For all the embodiments FIG. 2 shows that the tensilely strained SiGe portion 12 and the compressively strained SiGe portion 11 are in coplanar spatial relation with one another. FIG. 2A shows an embodiment when a layer transferring step in the fabrication has been omitted. The strained crystalline layers 11 and 12 remain on the Si substrate 160 on which the strained crystalline layer and the SiGe relaxed buffer 140 have been fabricated. The term relaxed means that the material, or layer, contains neither tensile nor compressive strain. The SiGe relaxed buffer 140 for its composition of SiGe it has the lattice constant of its equilibrium state. A support structure 130 is needed to make the lattice constant transition from the Si substrate 160, typically a Si wafer, to the SiGe relaxed buffer. The support structure itself 130 has various embodiments, as it was described in detail in the incorporated reference of U.S. patent application Ser. No. 10/073,562.

Figure 2B:
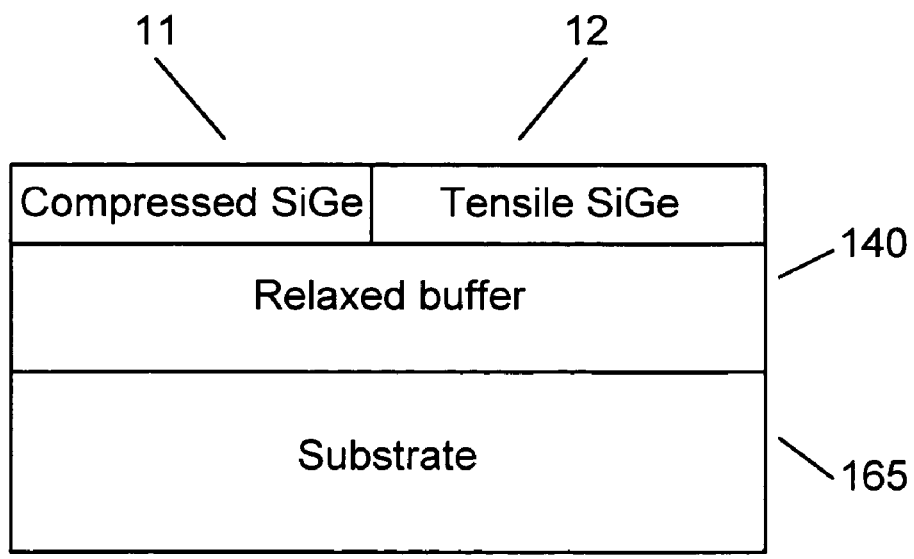

FIG. 2B shows an embodiment when a layer transfer has occurred, and the strained crystalline layers, 11 and 12, and the SiGe relaxed buffer 140 are on a new substrate 165. The substrate 165 typically is Si, but one skilled in the art would recognize other possible embodiments, such as a compound semiconductor substrate.

Figure 2C:
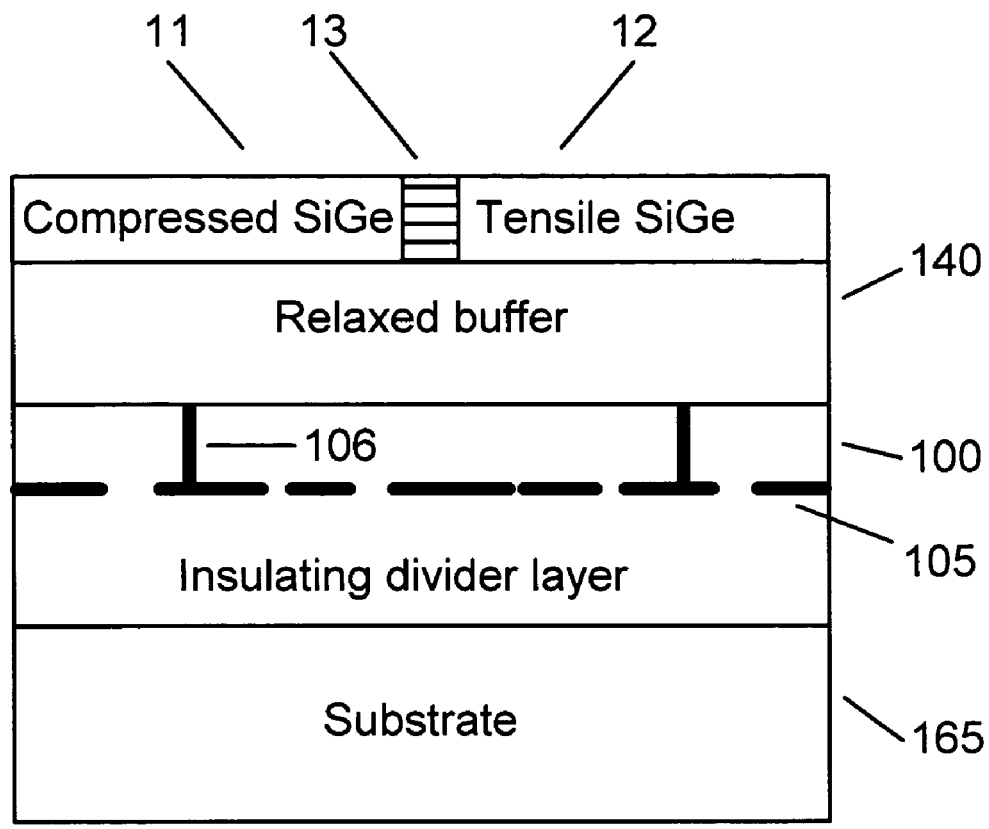

FIG. 2C shows an embodiment when a layer transfer has occurred, and the strained crystalline layer, 11 and 12, and the SiGe relaxed buffer 140 are again on a new substrate 165. The figure also shows an isolating trench 13 separating the compressively strained SiGe portion 11 and the tensilely strained SiGe portion 12. Such a trench can be desirable for further device processing, and it can help with the growth of the crystalline layers. The material of the isolating trench is typically silicon oxide, silicon nitride, and combinations and compounds of these materials.

The SiGe relaxed buffer in this preferred embodiment is disposed on top of an insulating divider layer 100, which in turn is disposed on top of a substrate 165. The composition of the insulating divider layer 100 depends on the actual application needs of the strained crystalline layer, as one skilled in the art would recognize. There is a wide variety of insulating materials in the insulating divider layer that can be selected for this layer 100, such as a silicon-oxide, a silicon-nitride, an aluminum-oxide, lithium-niobate, a "low-k" material, a "high-k" material, and combinations of these materials, such as silicon-oxynitride. In a preferred embodiment the insulating material in the insulating divider layer is $SiO_2$. FIG. 2C also shows at least one conducting plane 105 built into the insulating divider layer 100. This conducting layer, included in the insulating divider, layer may be a blanket layer, or as shown in the figure, patterned to conform ahead of time to the needs of the devices which will be fabricated later in the crystalline strained layers. There is capability also form more than one plane of such conducting layers. This conducting layer inside the insulating divider layer can reach the outside of the insulating divider layer with the use of at least one via 106. Fabrication of such conducting layers inside insulating layers is known in the arts, most commonly in the technology of multilevel wiring, or metallization, that almost all present day electronics chips are in need of.

The substrate 165 typically is Si. In case of Si substrate 165, the crystalline orientation of the substrate is usually (100), but this is not necessary. Depending on preference it can be, for instance (110), or (111). But, one skilled in the art would recognize other possible embodiments, such as a compound semiconductor like GaAs, or $Al_2O_3$, AlN, BeO, GaN, Quartz, or other substrate material. With the shrinking of dimension in all of microelectronics, there is a premium in decreasing the vertical dimension of layer thicknesses, as well. Device behavior dictates that the total thickness of conductive layers over an insulating layer to be as minimal as feasible. The thickness of the SiGe relaxed buffer 140 over the insulating divider layer 100 is between 1 nm and 100 nm, preferably between 5 nm and 60 nm.

Figure 3:
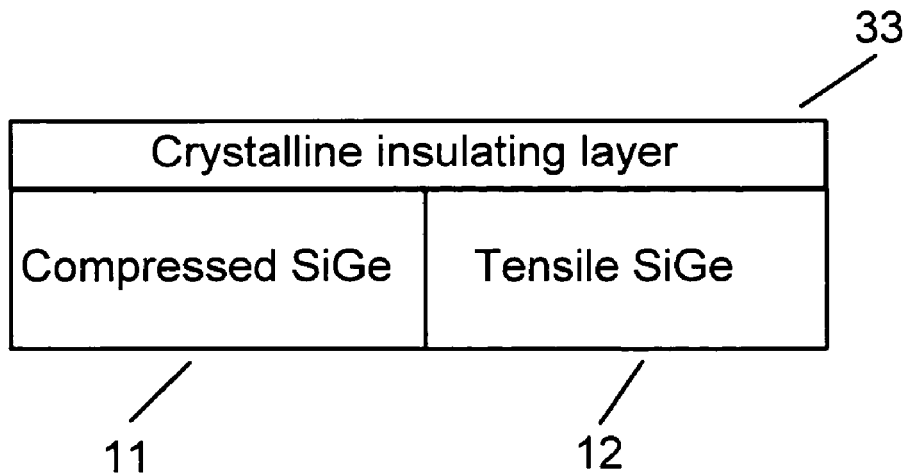
FIG. 3 Shows a cross sectional view of an epitaxial crystalline insulating layer disposed on top of the crystalline layer having a tensilely strained SiGe portion and a compressively strained SiGe portion.

FIG. 3 shows a cross sectional view of a epitaxial first crystalline insulating layer 33 disposed on top of the strained crystalline layer having a tensilely strained SiGe portion 12 and a compressively strained SiGe portion 11. In MOS device applications it is important to have an atomically smooth interface between the device channel and the gate insulator. For this reason it is advantageous to grow epitaxially such an insulating layer 33, typically an $SiO_2$ layer, on top of the strained crystalline layer. The thickness of this crystalline insulating layer may be as little as one atomic layer and typically not more than a few atomic layer. The thickness range of this first crystalline insulating layer 33 is between 0.3 nm and 1.5 nm. In device applications this crystalline insulating layer may serve as the gate insulator layer by itself, but more typically and additional non-crystalline insulator layer would be disposed on top of it. This first crystalline insulating layer 33 besides $SiO_2$ in other embodiments it can be silicon oxynitride, or further materials.

Figure 4:
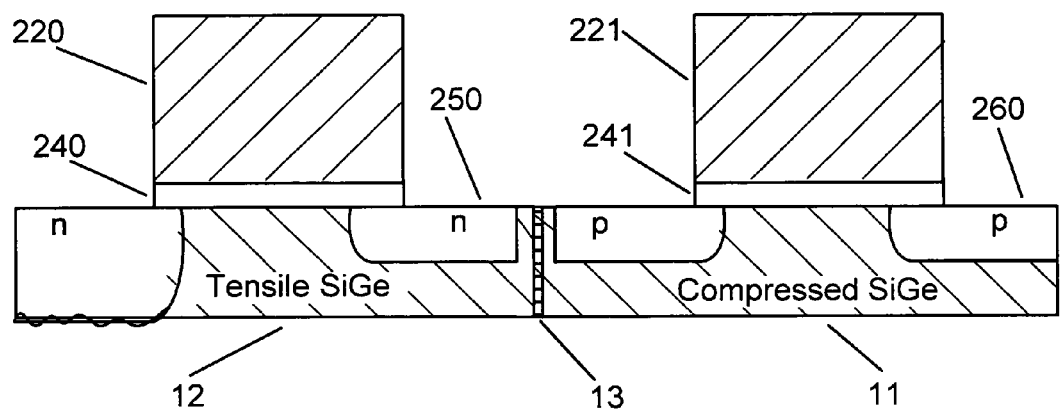
FIG. 4 Shows a cross sectional view of NMOS and PMOS devices hosted in differing portions of the crystalline layer.

FIG. 4 shows a cross sectional view of NMOS and PMOS devices hosted in differing portions of the strained crystalline layer. The main reason for creating a microelectronics quality tensilely stressed SiGe, or pure Si layer, are the advantageous electron transport properties. Accordingly, the performance of the circuits, and consequently the performance of any system that the circuits are part of, is optimally served if the tensilely strained SiGe is hosting electron conduction type devices, such as NMOS, one of the two mainstay devices of modern electronics. In FIG. 4 the tensilely strained SiGe 12 hosts an NMOS, with n-type source and drain junctions 250, gate insulator 240 and gate 220. Similarly, performance is served if the compressively strained SiGe is hosting hole conduction type devices, such as PMOS, the other of the two mainstay devices of modern electronics. In FIG. 4 the compressively strained SiGe 11 hosts a PMOS, with p-type source and drain junctions 260, gate insulator 241 and gate 221. The two layers 11 and 12, and consequently the devices are separated from each other by the isolating trench 13.

In processors it can happen that, for instance, for design convenience electron conduction type devices are also hosted in the compressive portion of the strained layer, and conversely, that hole conduction type devices are hosted in the tensilely strained portion of the strained layer. Such cross hosting of course would in poorer device performance, but it is well known in the art that not every single device even in high performance processors is critical.

In most common applications, as one skilled on the art would recognize, the NMOS and PMOS devices, each hosted in its own portion of the strained crystalline layer, would be wired into CMOS configurations.

Figure 5:
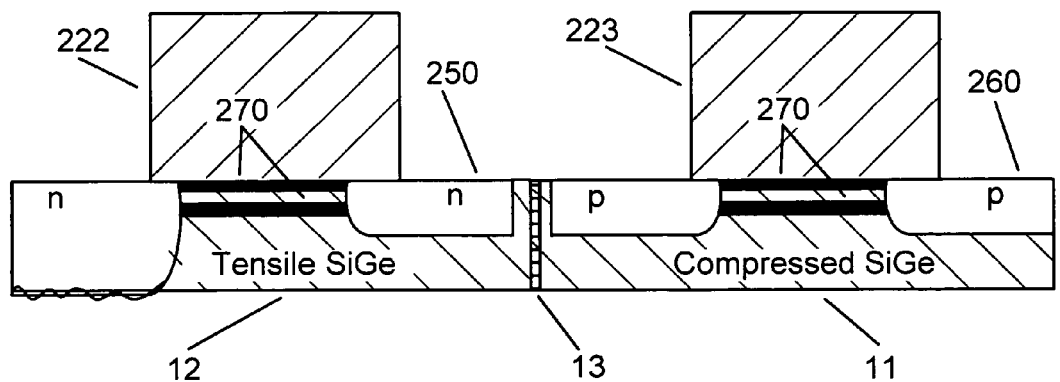
FIG. 5 Shows a cross sectional view of NMODFET and PMODFET devices hosted in differing portions of the crystalline layer.

FIG. 5 shows a cross sectional view of N-MODFET and P-MODFET devices hosted in differing portions of the strained crystalline layer. MODFET devices have been previously built in SiGe layers where the composition of the layers was tailored for device properties. Such is the invention of U.S. Pat. No. 5,534,713 to K. Ismail and F. Stern, titled "Complementary metal-oxide semiconductor transistor logic using strained SI/SIGE heterostructure layers" incorporated herein by reference, where the details of the MODFET structure and fabrication thereof can be found. However, this patent does not teach the present invention, in particular no SiGe MODFET has been disclosed in strained layers over an insulating layer, in a so called SGOI configuration. The importance of creating a microelectronics quality tensilely stressed SiGe is in the advantageous electron transport properties. Accordingly, an N-MODFET, an electron conduction type device, is hosted in the tensilely strained SiGe. N-type source and drain junctions 250 and gate 222 are indicated on FIG. 5. Similarly, the compressively strained SiGe is hosting the hole conduction type counterpart device the P-MODFET. P-type source and drain junctions 260 and gate 223 are indicated. The dark stripes 270 in both devices of FIG. 5 are schematic indications of additional layers, such as spacer and supply layers, that MODFET devices, in general, may be in need of. The two layers 11 and 12, and consequently the devices are separated from each other by the isolating trench 13.

In both FIG. 4 and FIG. 5 some of the pictured junctions of 250 and 260, are shown with an unresolved depth, indicating that the junction depth is not necessarily limited to the thickness of the strained crystalline layer. From the performance point of view the what matters most is that the channel is confined to the strained layers.

Figure 6:
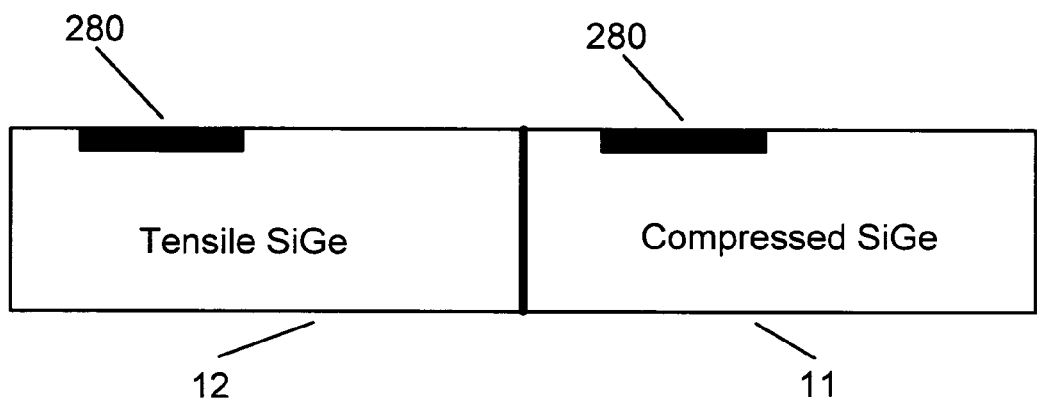
FIG. 6 Shows a schematic cross sectional view of optical devices hosted in differing portions of the crystalline layer.

FIG. 6 shows a schematic cross sectional view of optical devices hosted in differing portions of the strained crystalline layer. Adding the capabilities of optics to integrated circuits is a worthwhile pursuit in microelectronics. SiGe has attractive optical properties having a lower bandgap than pure Si. The strain is a further influence on the optical properties of the semiconductors. The figure shows optical devices 280 being hosted in both the tensilely strained SiGe and compressively strained SiGe. Such devices can be waveguides, couplers, and others. In a preferred embodiment a photodetector is hosted in the compressively strained SiGe.

Figure 7:
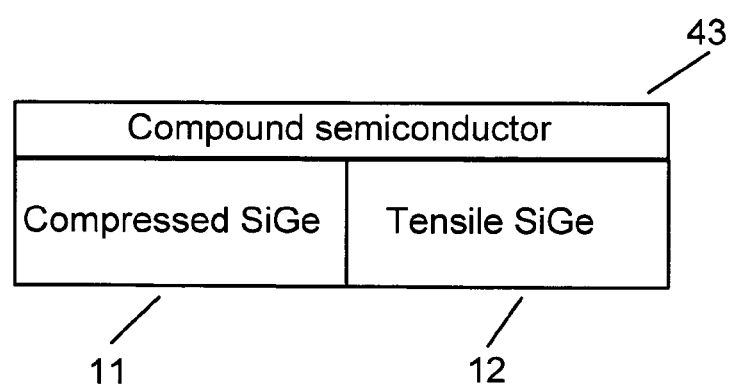
FIG. 7 Shows a cross sectional view of epitaxial crystalline compound semiconductor layer disposed on top of the crystalline layer having a tensilely strained SiGe portion and a compressively strained SiGe portion.

FIG. 7 shows a cross sectional view of an epitaxial crystalline compound semiconductor layer 43 disposed on top of the strained crystalline layer having a tensilely strained SiGe portion 12 and a compressively strained SiGe portion 11. The optical potential of a microelectronics chip can be further enhanced with the epitaxial deposition of a compound semiconductor on top of the strained crystalline layer. The strain and the composition of the SiGe allows for a wide range of lattice constants which can be adequately matched to the lattice of compound semiconductors, allowing for epitaxial growth. As the figure shows the compound semiconductor layer 43 is epitaxially deposited over regions of either tensilely strained SiGe 12, or compressively strained SiGe 11, or both. With the addition of compound semiconductors, such as GaAs, InAs, InP, InSb, SiC, and others, and ternaries, and quaternaries, as well, many optical applications, such as photodetecting and lasing, become possible.

Figure 8A:
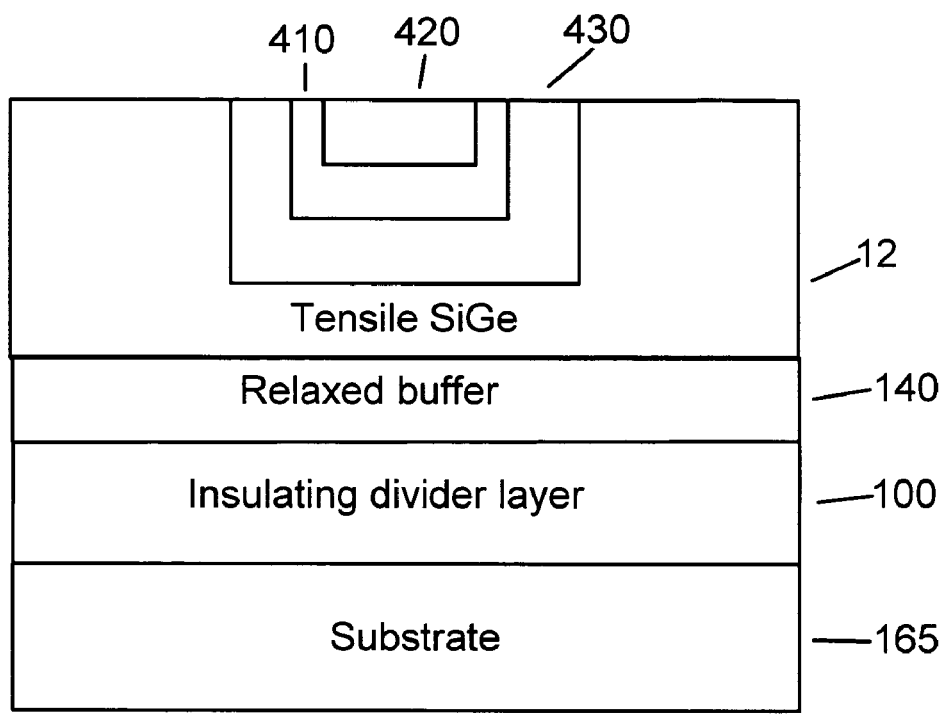
FIG. 8 Shows cross sectional views of bipolar devices hosted in differing portions of the crystalline layer on top of an insulating divider layer.
Figure 8B:
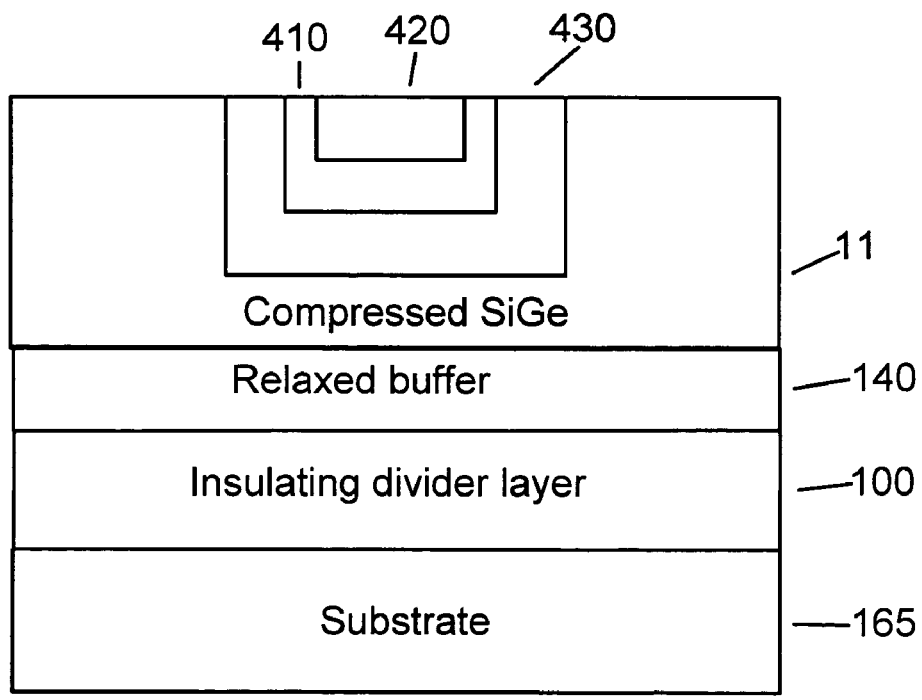

FIG. 8 shows cross sectional views of bipolar devices hosted in differing portions of the strained crystalline layer. Microelectronics is in need of integrating analog and digital circuits. This need is typically driven by communication demands, either within a processor, or to the external environment. Analog circuits are typically needed in interfacing with optical devices, the ones that also can serve the communication needs. Bipolar devices can be important components of analog circuits. In high performance processors, the kind that such a strained crystalline layer in an SGOI setting makes possible, bipolar devices can be of much value. FIG. 8A shows such a bipolar device in SGOI hosted in the tensilely strained SiGe portion. The insulating layer 100 is disposed between the substrate 165 and the relaxed buffer 140, with the tensilely strained SiGe 12 on top of the relaxed buffer. The bipolar device has its emitter 420, base 410, and collector 430 in the tensilely strained SiGe layer. FIG. 8B is almost identical with FIG. 8A except that the bipolar device now is hosed in the compressively strained SiGe layer. In some embodiments it is possible that the bipolar device reaches deeper than the thickness of the strained crystalline layer, and in this case part of the bipolar device can be accommodated in the relaxed buffer 140.

Figure 9A:
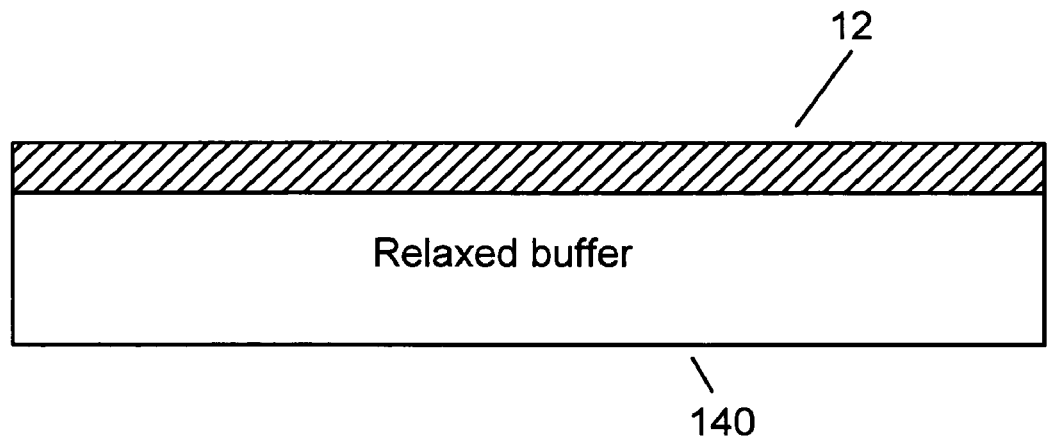
FIG. 9 Shows method steps in the fabrication of the crystalline layer having a tensilely strained SiGe portion and a compressively strained SiGe portion.
Figure 9B:
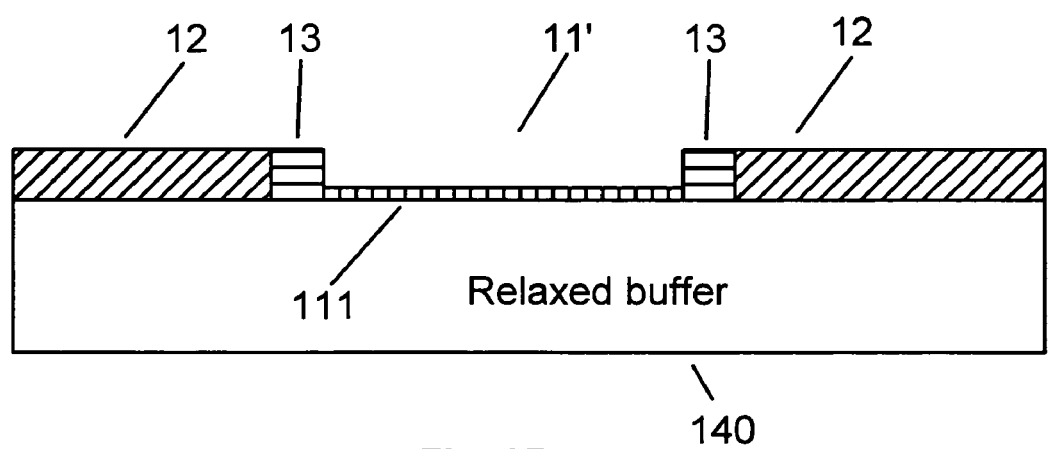
Figure 9C:
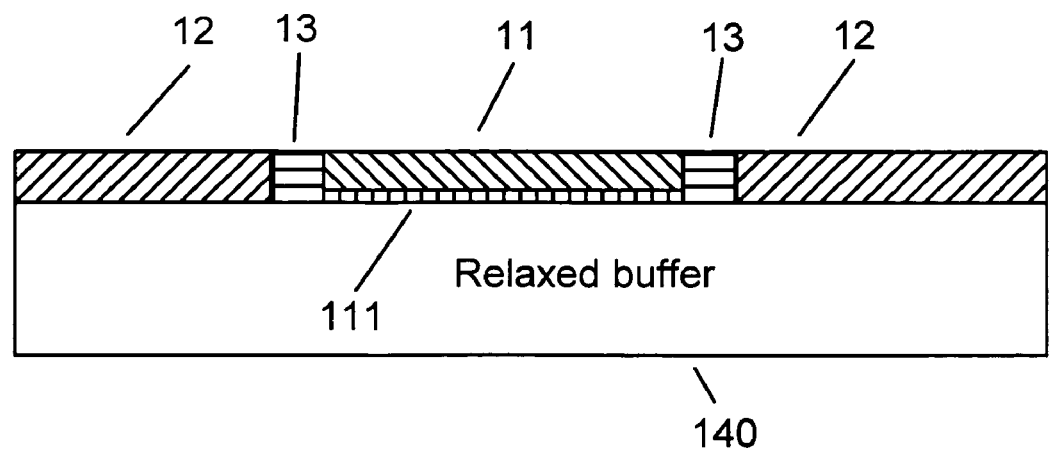

FIG. 9 shows method steps in the fabrication of the strained crystalline layer having a tensilely strained SiGe portion and a compressively strained SiGe portion. The steps of FIG. 9A to 9C show in a cross section schematics the steps which lead to the structure pictured on FIG. 1A, where the compressively strained SiGe portion form essentially island regions. FIG. 9A shows a SiGe layer 12 with a Ge concentration below that of the Ge concentration in the SiGe relaxed buffer being epitaxially deposited over the whole surface of the SiGe relaxed buffer 140. Since in this strained crystalline layer the Ge concentration, which can even be zero, is less than that of the SiGe relaxed buffer, the strained crystalline layer will be tensilely strained. Lower Ge concentration gives this strained crystalline layer a smaller lattice constant in its natural relaxed state than the lattice constant of the SiGe relaxed buffer. Since the epitaxy forces the two lattice constants to match, the crystalline microelectronics layer will have its lattice constant stretched in the plane of the layer. This stretching gives the tensile strain in the plane of the layer. Next, shown in FIG. 9B, this tensilely strained crystalline SiGe layer 12 is completely removed in those portions of the layer where the need is for a compressively strained SiGe layer 11'. Such removal operations are know in the art, for instance by masking with photoresist and using reactive ion etching (RIE).

For some embodiments it is preferred to build an insulating trench 13. This trench is desirable in later device processing, and can help with the selective growth of the strained crystalline layer 11 into the opening 11', by preventing growth form the sidewall of layer 12. The process is to fabricate an isolation dielectric strip along the sidewall of the tensilely strained SiGe layer 12. The dielectric strip covers the sidewall surface of the tensilely strained SiGe 12, since the sidewall surface has become exposed during the step of removing the tensilely strained SiGe. The material of this dielectric strip is typically silicon oxide, silicon nitride, and combinations and compounds of these materials. The fabrication of such a strip is known in the processing arts. Usually one fills the hole 11' with the dielectric and then either by masking, or by directional etching techniques defines the sidewall strip.

A further variation on a preferred embodiments is shown by the SiGe first seed layer 111. This first seed layer typically has less than 5% Ge content, but can have up to 25% of Ge concentration, and it is epitaxially deposited onto the relaxed buffer 140. The SiGe first seed layer may also be deposited with up to 1% of C concentration. Typically it is only about 1 nm thick, but can have a range between about 0.3 nm and 3 nm. The purpose of this first seed layer 111 is to rid and bury the surface of the relaxed buffer 140 of all damages and contaminations that resulted from the steps of removing layer 12, and following process steps. This first seed layer 111 is so thin that is much below the critical thickness of its composition, consequently is has no effect on the strain state of the compressively strained SiGe layer to be grown over it.

The use in any given embodiment of the isolating trench 13 and the first seed layer 111 are independent of one another. In any given embodiment one or the other, both, or neither may be present.

Finally, shown in FIG. 9C, a compressively strained SiGe layer 11 is epitaxially deposited to the portion 11' which is was prepared for it. This epitaxial deposition typically occurs in a selective manner. The reexposed SiGe relaxed buffer, or the first seed layer 111, serves as starting surface for layer 11. Since in this strained crystalline layer the Ge concentration is above that of the SiGe relaxed buffer, the strained crystalline layer will be compressively stressed. Higher Ge concentration gives this strained crystalline layer a larger lattice constant in its natural relaxed state than the lattice constant of the SiGe relaxed buffer. Since the epitaxy forces the two lattice constants to match, the crystalline microelectronics layer will have its lattice constant compressed in the plane of the layer. This compressing gives the compressive strain in the plane of the layer. After this second epitaxy step the strained crystalline layer having a tensilely strained SiGe portion 12 and a compressively strained SiGe portion 11 is completed. The dielectric strip 13 has after the growth of layer 11 become an isolating trench 13 separating the tensilely strained SiGe portion 12 from the compressively strained SiGe portion 11.

With the shrinking of dimension in all of microelectronics, there is a premium in decreasing the vertical dimension of layer thicknesses, as well. The thickness to which the the strained layers 11 and 12 are grown can be between about 0.1 nm and 100 nm, with a preferable thickness range of about 0.5 nm to 50 nm.

As described so far, the compressively strained crystalline SiGe layer 11 has a constant composition. In some embodiments this may be altered. Mainly in embodiments where a high, maybe 100% Ge concentration is needed, during the growth of layer 11 the Ge concentration can be varied. The final layer 11 has a nonuniform, or graded Ge concentration, typically increasing towards the surface. This grading facilitates the growing of highly compressed, layers. The critical operations of state of the art devices, such as PMOS devices, are concentrated to an extremely thin layer on the surface. Consequently, for device operation really only matters the strain on the surface of layer 11, and grading of the Ge concentration is well tolerated.

Figure 10A:
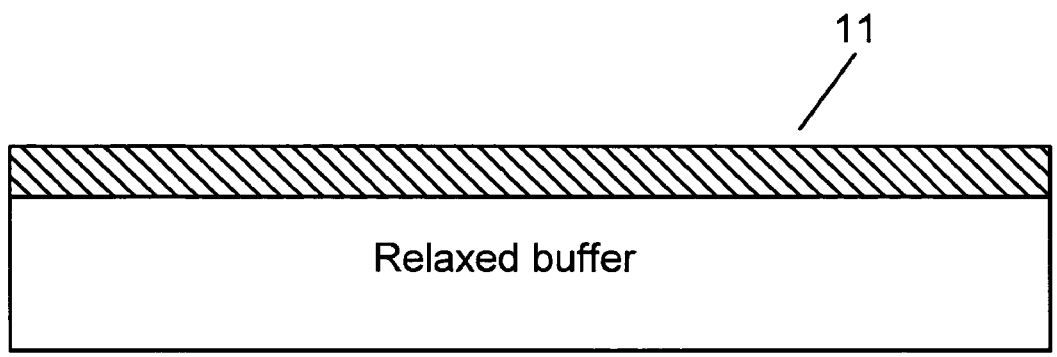
FIG. 10 Shows alternate method steps in the fabrication of the crystalline layer having a tensilely strained SiGe portion and a compressively strained SiGe portion.
Figure 10B:
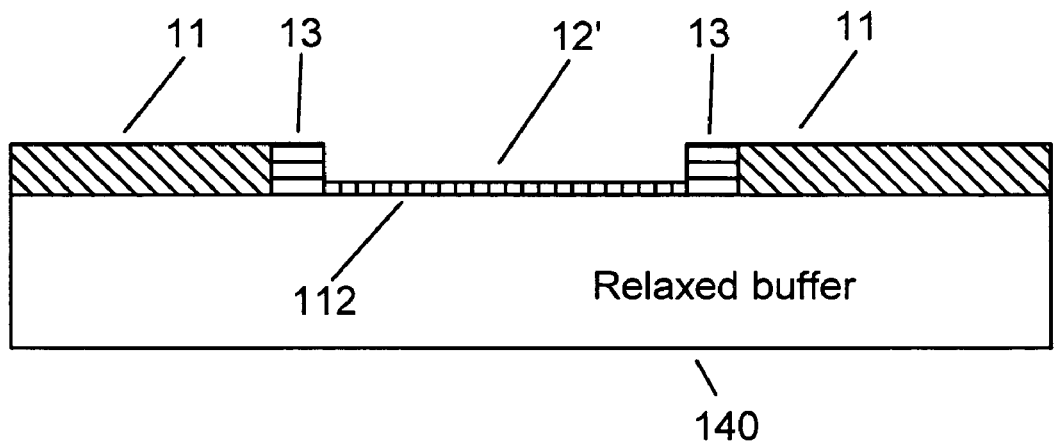
Figure 10C:
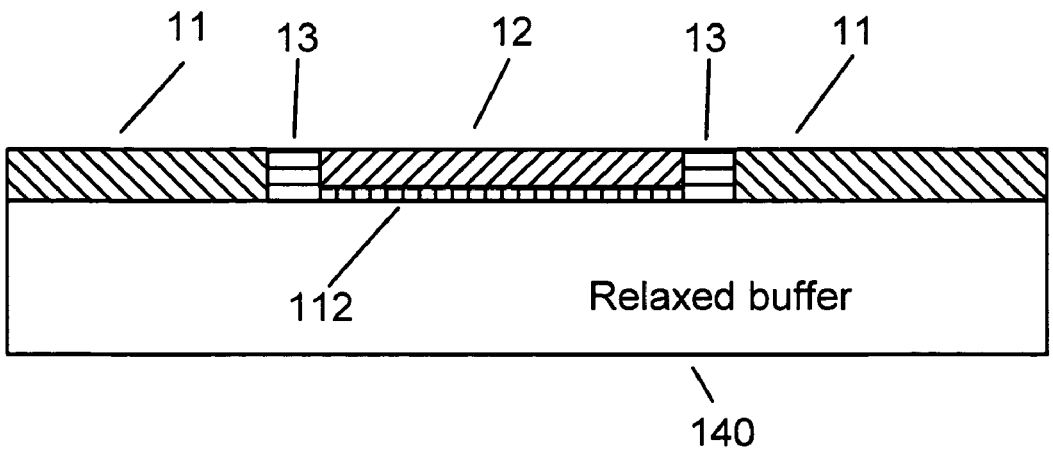

FIG. 10 shows alternate method steps in the fabrication of the strained crystalline layer having a tensilely strained SiGe portion and a compressively strained SiGe portion. The steps of FIG. 10A to 10C show in a cross section schematics the steps which lead to the structure pictured on FIG. 1B, where the tensilely strained SiGe portion form essentially island regions. This alternate method is preferred to one depicted in FIG. 9, when a relatively high, possibly even 100% Ge concentration is desired in the compressed SiGe layer. FIG. 10A shows a SiGe layer 11 with a Ge concentration above that of the Ge concentration in the SiGe relaxed buffer being epitaxially deposited over the whole surface of the SiGe relaxed buffer 140. Since in this strained crystalline layer the Ge concentration, which can even be 100%, is higher than that of the SiGe relaxed buffer, the strained crystalline layer will be compressively stressed. Higher Ge concentration gives this strained crystalline layer a larger lattice constant in its natural relaxed state than the lattice constant of the SiGe relaxed buffer. Since the epitaxy forces the two lattice constants to match, the crystalline microelectronics layer will have its lattice constant compressed in the plane of the layer. This compression gives the compressive strain in the plane of the layer. Next, shown in FIG. 10B, this compressively strained crystalline SiGe layer 11 is completely removed in those portions of the layer where the need is for a tensilely strained SiGe layer 12'. Such removal operations are know in the art, for instance by masking or patterning with photoresist and using reactive ion etching (RIE).

As described so far the compressively strained crystalline SiGe layer 11, has a constant composition. In some embodiments the compressively strained crystalline SiGe layer 11 may have a non uniform concentration. This is mainly in embodiments where a high, maybe 100% Ge concentration is needed. In this case layer 11 has a nonuniform, or graded Ge concentration, typically increasing towards the surface. This grading facilitates the growing of highly compressed, layers. The critical operations of state of the art devices, such as PMOS devices, are concentrated to an extremely thin layer on the surface. Consequently, for device operation really only matters the strain on the surface of layer 11, and grading of the Ge concentration is well tolerated.

For some embodiments it is preferred to build an insulating trench 13. This trench is desirable in later device processing, and it can help with the selective growth of the strained crystalline layer 12 into the opening 12', by preventing growth form the sidewall of layer 11. The process is to fabricate an isolation dielectric strip along the sidewall of the compressively strained SiGe layer 11. The dielectric strip covers the sidewall surface of the compressively strained SiGe 12, since the sidewall surface has become exposed during the step of removing the compressively strained SiGe. The material of this dielectric strip is typically silicon oxide, silicon nitride, and combinations and compounds of these materials. The fabrication of such a strip is known in the processing arts. Usually one fills the hole 12' with the dielectric and then either by masking, or by directional etching techniques defines the sidewall strip.

A further variation on a preferred embodiments is shown by a second seed layer 112. This second seed layer 112 typically has less than 5% Ge content, but can have up to 25% of Ge concentration, and it is epitaxially deposited onto the relaxed buffer 140. The SiGe second seed layer may also be deposited with up to 1% of C concentration. Typically it is only about 1 nm thick, but can have a range between about 0.3 nm and 3 nm. The purpose of this second seed layer 112 is to rid and bury the surface of the relaxed buffer 140 of all damages and contaminations that resulted from the steps of removing layer 11, and following process steps. This second seed layer 112 is so thin that is much below the critical thickness of its composition, consequently is has no effect on the strain state of the tensilely strained SiGe layer 12 to be grown over it.

The use in any given embodiment of the isolating trench 13 and the second seed layer 112 are independent of one another. In any given embodiment one or the other, both, or neither may be present.

Finally, shown in FIG. 10C, a tensilely strained SiGe layer 12 is epitaxially deposited to the portion 12' which is was prepared for it. This epitaxial deposition typically occurs in a selective manner. The reexposed SiGe relaxed buffer, or the second seed layer 112, serves as starting surface for layer 12. Since in this strained crystalline layer the Ge concentration is below that of the SiGe relaxed buffer, the strained crystalline layer will be tensilely strained. Lower Ge concentration gives this strained crystalline layer a smaller lattice constant in its natural relaxed state than the lattice constant of the SiGe relaxed buffer. Since the epitaxy forces the two lattice constants to match, the crystalline microelectronics layer will have its lattice constant stretched in the plane of the layer. This stretching gives the tensile strain in the plane of the layer. After this second epitaxy step the strained crystalline layer having a tensilely strained SiGe portion 12 and a compressively strained SiGe portion 11 is completed. The dielectric strip 13 has after the growth of layer 11 become an isolating trench 13 separating the tensilely strained SiGe portion 12 from the compressively strained SiGe portion 11.

The first and second seed layers 111 and 112 have essentially the same properties. they only differ in what kind of layer, tensile or compressive, will be grown over them.

With the shrinking of dimension in all of microelectronics, there is a premium in decreasing the vertical dimension of layer thicknesses, as well. The thickness to which the the strained layers 11 and 12 are grown, independently of which method is utilized, can be between about 0.1 nm and 100 nm, with a preferable thickness range of about 0.5 nm to 50 nm.

The following discussion will detail the steps of a preferred embodiment leading to a SiGe relaxed buffer—ready to accept the strained crystalline layers as shown in FIGS. 9 and 10—on top an insulating divider layer. Alternative steps leading to differing embodiments will also be pointed out.

Figure 11:
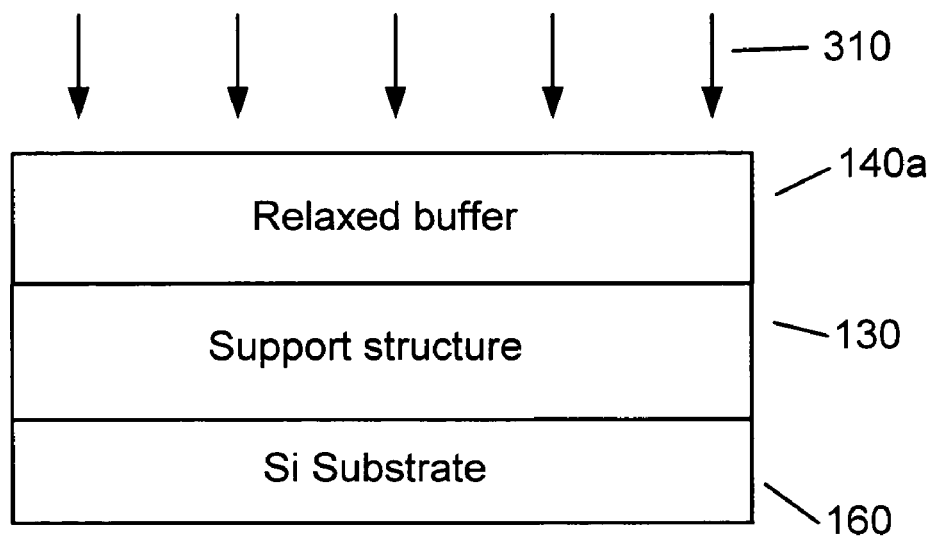
FIG. 11 Shows a smoothing step in the method of fabricating a SiGe relaxed buffer.

FIG. 11 shows a smoothing step in the method of fabricating a SiGe relaxed buffer. A support structure 130 is epitaxially deposited first over a Si substrate 160. Growing the support structure is detailed in the incorporated U.S. patent application Ser. No. 10/073,562. Next, a first part of the SiGe relaxed buffer 140a is grown epitaxially over the support structure. This layer is referenced as 140a as being the SiGe relaxed buffer layer in some embodiments, but at the same time not being part of the final product in other embodiments, namely where a layer transfer is executed.

The next step is the smoothing 310 of this first part of the SiGe relaxed buffer 140a to approximately below 0.5 nm RMS of surface roughness. This step typically is done by CMP, or alternatively by ion milling, but the preferred choice is GCIB processing which can easily target for the highest degree of wafer uniformity for any desired thicknesses and still maintain the lowest degree of surface roughness. For an embodiment of the invention when the layers are not transferred from the originally used Si substrate 160, this first part of the SiGe relaxed buffer 140a is chosen as the SiGe relaxed buffer, which is ready to accept the strained crystalline layers as shown in FIGS. 9 and 10.

Figure 12:
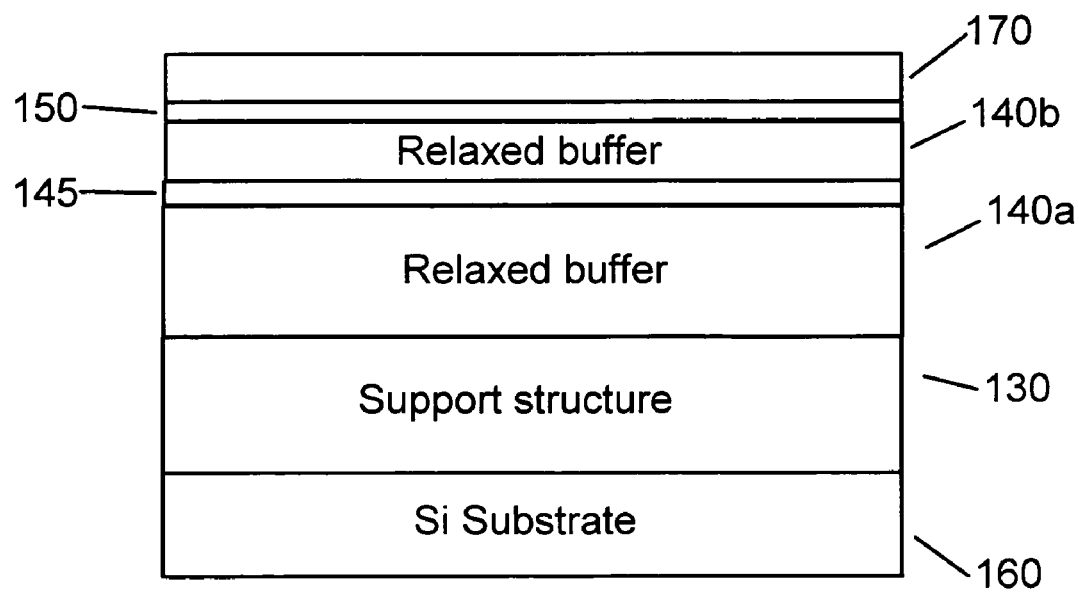
FIG. 12 Shows further layer depositing steps in the method of fabricating a SiGe relaxed buffer.

FIG. 12 further shows the layer depositing steps in the method of fabricating a relaxed SiGe buffer. These deposition steps are needed as preparation for layer transferring, in particular, for transferring just a very thin part of the SiGe relaxed buffer. The next step is depositing epitaxially a thin Si layer 145 over the smoothed first part of said SiGe relaxed buffer. This Si layer is typically chosen to be less than about 10 nm, about 1 nm to 15 nm thick, but can be as thick as 50 nm. In any case, layer 145 is below its critical thickness, and its purpose is to serve as an etch stopping layer after the layer transferring step. (Critical thickness for a layer is that thickness over which the layer begins to relax back toward its equilibrium lattice spacing, and structural defects are formed.) The Si layer deposition is followed by depositing epitaxially the second part of the SiGe relaxed buffer 140b over the thin Si layer. This layer is referenced as 140b as being the SiGe relaxed buffer layer itself in some of the embodiments, but at the same time not even being deposited in another embodiment, namely when there is no layer transfer involved. The thickness of layer 140b is chosen to be between about 0.25 nm and 100 nm, with a preferred range of about 5 nm to 60 nm.

Figure 13A:
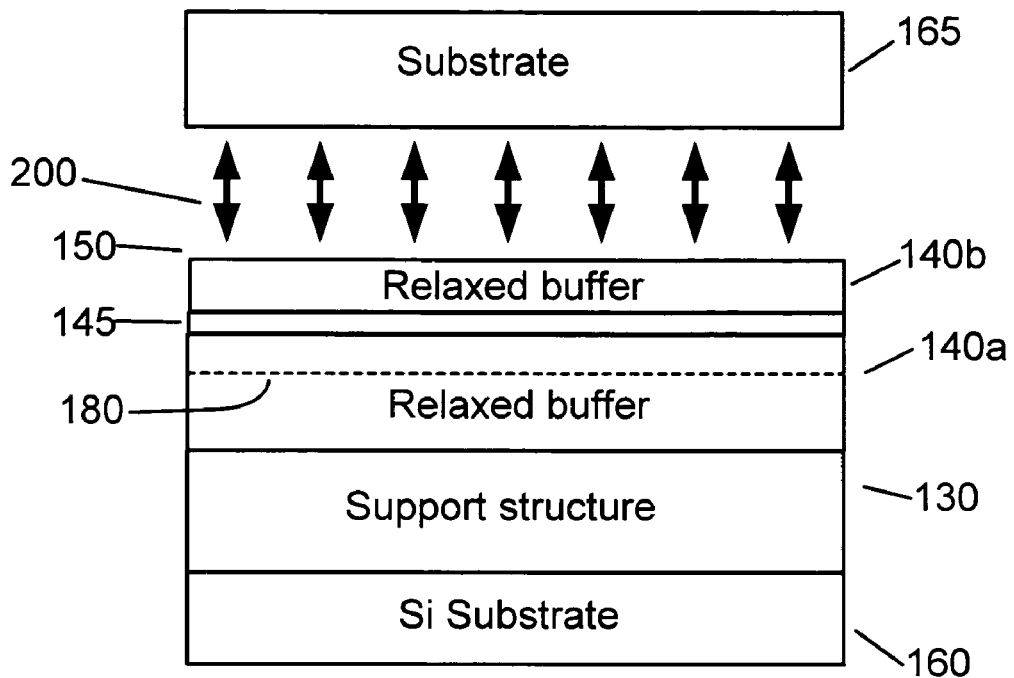
FIG. 13 Shows a layer transferring step.

In one embodiment some of the layers are now transferred 200 over onto a new substrate as shown on FIG. 13A. The second part of the SiGe relaxed buffer 140b is bonded onto a new substrate 165. A preferred method for layer transfer is the SmartCut, and the approximate cutting location is indicated 180 inside the first part of the SiGe relaxed buffer 140a. Apart from the SmartCut other layer transferring methods may also be used. After the bonding and the separation, the second part of the SiGe relaxed buffer 140b and the thin Si layer 145 are now secured to the new substrate. In a preferred embodiment the new substrate is a Si substrate, but one skilled in the art would notice that other substrates, such as a compound semiconductor substrate, or other crystallographic orientations Si(110) and Si(111) can be used as well.

In an alternate embodiment some of the layers are transferred 200 over onto a new substrate 165 with an insulating divider layer interposed between the new substrate and the second part of the SiGe relaxed buffer. A special, and preferred, variation regarding the insulating divider layer, of this embodiment is shown on FIG. 13B. Here too the preferred method for layer transfer is the SmartCut, and the approximate cutting location is indicated 180 inside the first part of the SiGe relaxed buffer 140a. Apart from the SmartCut other layer transferring methods may also be used. After the securing and the separation, the second part of the SiGe relaxed buffer 140b and the thin Si layer 145 are now bonded to the new substrate. In a preferred embodiment the new substrate is a Si substrate, but one skilled in the art would notice that other substrates, such as a compound semiconductor substrate, semi-insulating substrate, or other crystallographic orientations Si(110) and Si(111) can be used as well.

Figure 13B:
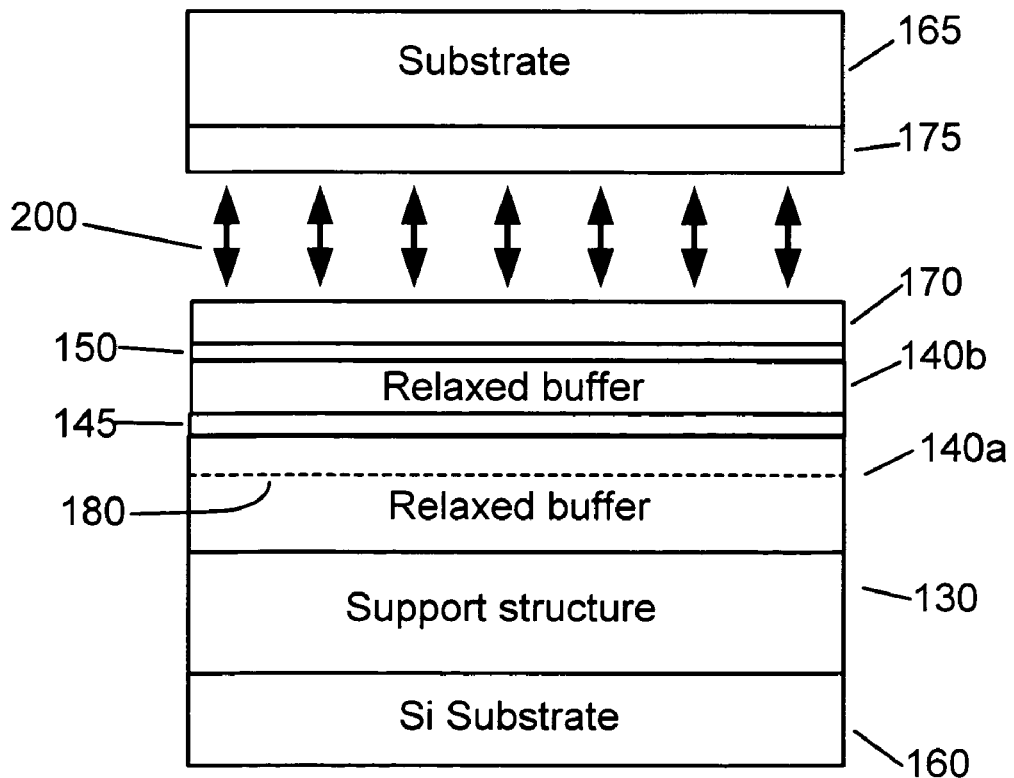

A preferred variation on the insulator divider layer is shown in the layer transfer step of FIG. 13B. As also shown on FIG. 12, a between about 0.3 nm and 1.5 nm thick second crystalline $SiO_2$ layer 150 is grown epitaxially onto said second part of said SiGe relaxed buffer, serving as a protective layer for the SiGe relaxed buffer layer, as well as, for securing a strong oxide bond to the SiGe relaxed buffer. This thin epitaxial oxide layer is preferably covered for additional protection and for better bonding purposes, by depositing a first insulator layer 170 on top of it. This first insulator layer is preferably again $SiO_2$. The new substrate 165 itself may be covered with an insulating layer 175. After securing, or bonding, the layers together, layers 150, 170, and 175 jointly make up the insulating divider layer 100, which is interposed between the new substrate and the second SiGe relaxed buffer. One skilled in the art would notice that there are more variations possible in selecting in which way an insulator layer is applied to be interposed between the new substrate and the second SiGe relaxed buffer. For instance, any one of the layers, or some combinations of two of the layers 150, 170, and 175 may be omitted.

Figure 14:
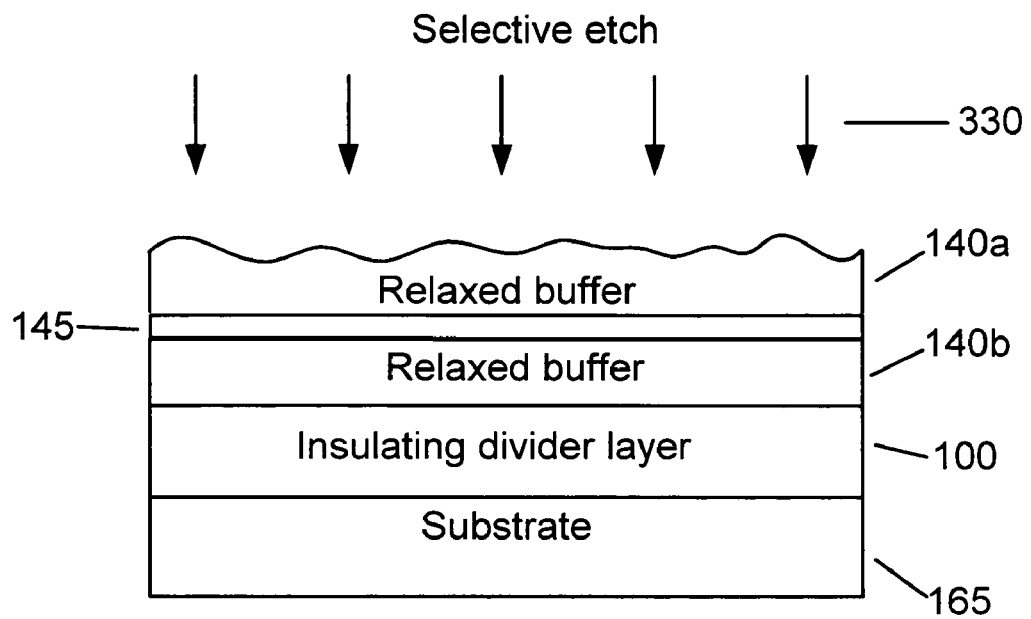
FIG. 14 Shows a SiGe layer removing step by selective etching the transferred layered structure.
Figure 15:
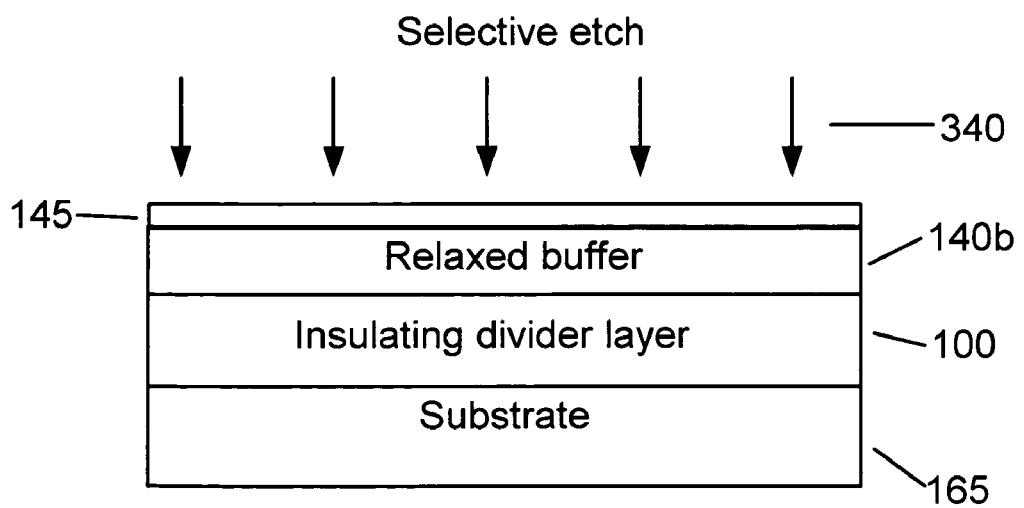
FIG. 15 Shows a Si layer removing step by selective etching the transferred layered structure.

FIGS. 14 and 15 show further steps in reaching the goal of having a high quality and thin SiGe relaxed buffer layer on a new substrate. The figures show the embodiment where there is an insulator layer 100 interposed, but even in the absence of such a layer the final steps in the SiGe relaxed buffer layer preparation, which is readied for accepting the strained device layers, remain the same.

FIG. 14 shows SiGe layer removing steps in the transferred layered structure. The remainder of the first part of the SiGe relaxed buffer layer 140 has to be removed first. This step is accomplished by etching 330 with a first selective etch, employing the thin Si layer 145 as an etch stop. A suitable etchent that dissolves SiGe but stops on pure Si is for instance, a 1:2:3 solution of $HF:H_2O_2$:AceticAcid, or alternatively, a solution of either $NH_4OH:H_2O_2:H_2O$ or $NH_4OH:H_2O_2$:AceticAcid. As one skilled in art would recognize, if the remainder of the first SiGe layer after transfer is relatively thick, a grinding step may precede the etching step. This grinding step depending on the embodiment may be mechanical, or process oriented, such as ion milling, or Gas Cluster Ion Beam processing.

FIG. 15 shows the Si layer 145 removing step, by selectively etching the transferred layered structure 340. One is employing a second selective etch, using the second part of the SiGe relaxed buffer layer as an etch stop. A suitable etchent that dissolves Si but stops on SiGe is for instance, a solution of EPPW, KOH or TMAH. After having etched away the thin Si layer, the second part of the SiGe relaxed buffer layer becomes exposed. This layer is now suitable to serve as the SiGe relaxed buffer layer upon which the microelectronically important layers can be deposited.

In all embodiments the Ge concentration in the SiGe relaxed buffer is in the 10% to 40% range.

One skilled in the art would notice that if the thinness, on the order of less than 60 nm, of the SiGe relaxed buffer layer is not an important consideration, typically in the embodiment when the layer transfer occurs to a new substrate without an interposed insulating divider layer, then the processing steps can be simplified somewhat, at the expense of precision in thickness control. For instance, the Si layer 145 and the second part of SiGe relaxed buffer 140b can be omitted, since after transferring the first part of the SiGe relaxed buffer 140a, grinding and polishing techniques can be used to remove the unwanted material from the SiGe relaxed buffer.

The steps leading up to the creation of the strained crystalline layer in preferred embodiments are done by a UHV-CVD processes, and preferably in an AICVD system as described in U.S. Pat. No. 6,013,134 to J. Chu et al, titled: "Advanced Integrated Chemical Vapor Deposition (AICVD) for Semiconductor Devices", incorporated herein by reference. The AICVD system is also capable to go beyond the layer creation, and in situ fabricate device structures in the strained SiGe layers. The UHV-CVD method, and in particular the AICVD system is well suited to handle the large diameter, 8 in or 10 in, Si wafers of today technologies, or the diameters that may becoming standards in the future. UHV-CVD poses no inherent limit onto the diameter of the wafers and layers to be processed. Those skilled in the art, however, will recognize that other than UHV-CVD method may also be used in the fabrication processed described in this invention. Such methods may be LP (low pressure)-CVD, or RT (rapid thermal)-CVD.

Figure 16:
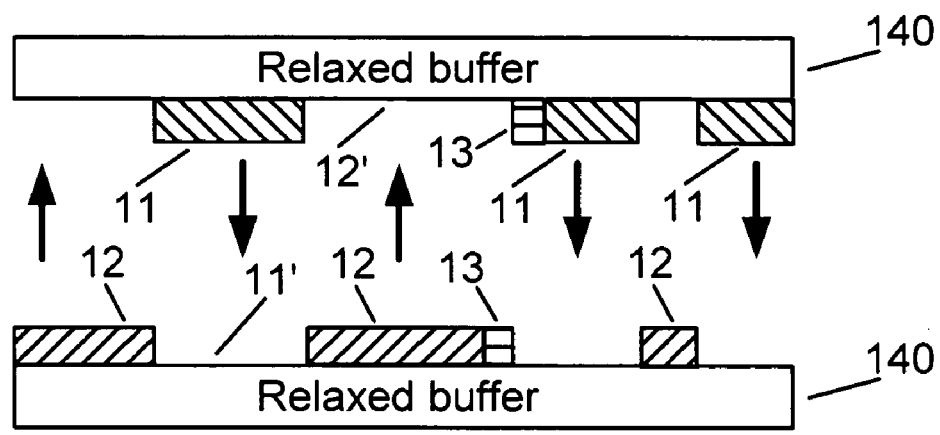
FIG. 16 Shows a pivotal step in an alternate method for fabricating the crystalline layer having a tensilely strained SiGe portion and a compressively strained SiGe portion.

FIG. 16 shows a pivotal step in an alternate method for creating a strained crystalline layer divided into two complementary regions, a first region consisting essentially of a tensilely strained SiGe layer 12, and a second region consisting essentially of a compressively strained SiGe layer 11. First one fabricates with the methods discussed earlier a tensilely strained SiGe layer. Simultaneously on a second substrate one fabricates with the methods discussed earlier a compressively strained SiGe layer, which has essentially same thickness as said tensilely strained SiGe layer. Next, one removes the tensilely strained SiGe in places corresponding to the second region 12', and removes the compressively strained SiGe layer in places corresponding to said first region 11'. The two layers, now with matching "tooth" structure are bonded, such that the SiGe layers are oriented for interlocking the complementary first and second regions, whereby the tensilely strained SiGe layer and the compressively strained SiGe layer form the strained crystalline layer divided into two complementary regions. Finally one removes an excess of material covering the strained crystalline layer, all the way down, including one of the SiGe relaxed buffer layers 140. The excess of material to be removed resulted from the bonding step.

In the method depicted on FIG. 16 a dielectric strip 13 can be utilized just like shown in FIGS. 9 and 10. Here it chiefly serves to lessen the degree of critical alignment between the two sides, 11 and 12. After bonding it becomes an insulating trench layer 13 between the tensilely strained and the compressively strained layers.

Figure 17:
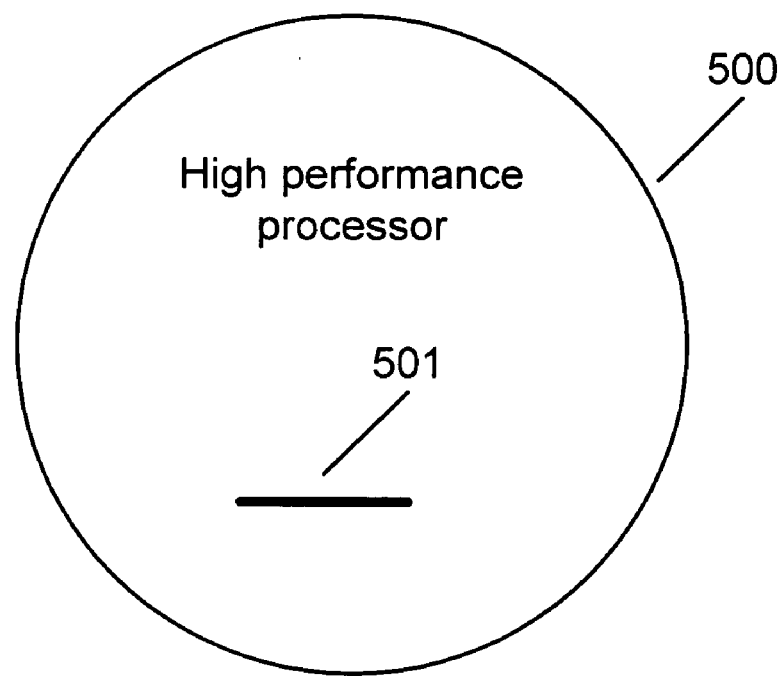
FIG. 17 Schematically shows a processor having a chip. The chip contains devices and circuits hosted in a crystalline layers having a tensilely strained SiGe portion and a compressively strained SiGe portion.

FIG. 17 schematically shows a processor 500 comprising a chip, which chip 501 is having a strained crystalline layer with a tensilely strained SiGe portion and a compressively strained SiGe portion. This strained crystalline layer is hosting devices and circuits. With the implementation of devices in the appropriately strained SiGe layers such processors would find utility in a variety of areas where the highest performances are needed.

Many modifications and variations of the present invention are possible in light of the above teachings, and could be apparent for those skilled in the art. The scope of the invention is defined by the appended claims.

I claim:

1. A method for creating a strained crystalline layer having a tensilely strained SiGe layer portion and a compressively strained SiGe layer portion, comprising the step of:

bonding epitaxially said strained crystalline layer over a SiGe relaxed buffer layer, wherein said tensilely strained SiGe and said compressively strained SiGe are epitaxially bonded over said SiGe relaxed buffer layer in coplanar spatial relation, wherein the Ge concentration of said tensilely strained SiGe is chosen to be below the Ge concentration of said SiGe relaxed buffer, and the Ge concentration of said compressively strained SiGe is chosen to be above the Ge concentration of said SiGe relaxed buffer.

2. The method of claim 1, wherein in the step of epitaxially bonding said tensilely strained SiGe layer, an up to about 15% Ge concentration is chosen for said tensilely strained SiGe layer.

3. The method of claim 1, wherein in the step of epitaxially bonding said compressively strained SiGe layer an up to about 70% Si concentration is chosen for said compressively strained SiGe layer.

4. The method of claim 1, wherein in the step of epitaxially bonding said tensilely strained SiGe layer, an up to about 1% C concentration is chosen for said tensilely strained SiGe layer.

5. The method of claim 1, wherein in the step of epitaxially bonding said compressively strained SiGe layer an up to about 1% C concentration is chosen for said compressively strained SiGe layer.

6. The method of claim 1, wherein the step of epitaxially bonding said compressively strained SiGe layer further comprises a process of grading the Ge concentration in said compressively strained SiGe layer.

7. The method of claim 1, wherein said strained crystalline layer is chosen to be between about 0.1 nm and 100 nm thick.

8. The method of claim 1, wherein the step of epitaxially bonding further comprises the steps of:
   growing epitaxially said tensilely strained SiGe layer over said SiGe relaxed buffer layer;
   removing said tensilely strained SiGe over that portion of said SiGe relaxed buffer layer which is to be occupied by said compressively strained SiGe layer, wherein forming at least one opening in said tensilely strained SiGe layer; and
   growing epitaxially said compressively strained SiGe layer in said at least one opening.

9. The method of claim 8, further comprising the step of:
   depositing epitaxially a SiGe first seed layer with up to 25% Ge concentration, wherein this step is executed before said step of growing epitaxially said compressively strained SiGe.

10. The method of claim 9, wherein said SiGe first seed layer is chosen to have up to about 1% C concentration.

11. The method of claim 9, wherein said SiGe first seed layer is chosen to be between about 0.3 nm and 3 nm thick.

12. The method of claim 8, further comprising the step of:
   constructing an isolation dielectric strip, wherein said strip covers a sidewall surface of said tensilely strained SiGe, wherein said sidewall surface has become exposed during said step of removing said tensilely strained SiGe, whereby said isolation dielectric strip will become an isolating trench separating said tensilely strained SiGe portion and said compressively strained SiGe portion.

13. The method of claim 1, wherein the step of epitaxially bonding further comprises the steps of:
   growing epitaxially said compressively strained SiGe layer over said SiGe relaxed buffer layer;
   removing said compressively strained SiGe over that portion of said SiGe relaxed buffer layer which is to be occupied by said tensilely strained SiGe layer, wherein forming at least one opening in said compressively strained SiGe layer; and
   growing epitaxially said tensilely strained SiGe layer in said at least one opening.

14. The method of claim 13, further comprising the step of:
   depositing epitaxially a SiGe second seed layer with up to 25% Ge concentration, wherein this step is executed before said step of growing epitaxially said compressively strained SiGe.

15. The method of claim 14, wherein said SiGe second seed layer is chosen to have up to about 1% C concentration.

16. The method of claim 14, wherein said SiGe second seed layer is chosen to be between about 0.3 nm and 3 nm thick.

17. The method of claim 13, further comprising the step of:
   constructing an isolation dielectric strip, wherein said strip covers a sidewall surface of said compressively strained SiGe, wherein said sidewall surface has become exposed during said step of removing said compressively strained SiGe, whereby said isolation dielectric strip will become an isolating trench separating said compressively strained SiGe portion and said tensilely strained SiGe portion.

18. The method of claim 1, wherein said method further comprises the fabrication of said SiGe relaxed buffer layer, comprising the steps of:
   depositing epitaxially a support structure over a Si substrate; and
   growing epitaxially a first part of said SiGe relaxed buffer over said support structure.

19. The method of claim 18, wherein the step of fabricating said SiGe relaxed buffer layer further comprises the step of smoothing said first part of said SiGe relaxed buffer to below about 0.5 nm RMS of surface roughness.

20. The method of claim 19, wherein the step of fabricating said SiGe relaxed buffer layer further comprises the step of using said smooth first part of said SiGe relaxed buffer as said SiGe relaxed buffer layer.

21. The method of claim 19, wherein the step of fabricating said SiGe relaxed buffer layer further comprises the steps of:
   depositing epitaxially a thin Si layer over said smooth first part of said SiGe relaxed buffer; and
   depositing epitaxially a second part of said SiGe relaxed buffer over said thin Si layer.

22. The method of claim 21, wherein said thin Si layer is chosen to be between about 1 nm and 15 nm thick.

23. The method of claim 21, wherein said second part of said SiGe relaxed buffer is chosen to be between about 0.25 nm and 100 nm thick.

24. The method of claim 21, wherein the step of fabricating said SiGe relaxed buffer layer further comprises the steps of:
   bonding said second part of said SiGe relaxed buffer onto a new Si substrate;
   performing a layer transfer of said second part of said SiGe relaxed buffer and said thin Si layer;
   etching away remainder of said first part of said SiGe relaxed buffer with a first selective etch, employing said thin Si layer as etch stop; and
   etching away said thin Si layer with a second selective etch, employing said second part of said SiGe relaxed buffer as etch stop, whereby exposing said second part of said SiGe relaxed buffer and using said second part of said SiGe relaxed buffer as said SiGe relaxed buffer layer.

25. The method of claim 21, wherein the step of fabricating said SiGe relaxed buffer layer further comprises the steps of:
   securing said second part of said SiGe relaxed buffer to a new Si substrate, with an insulating divider layer interposed therebetween said second part of said SiGe relaxed buffer and said new substrate;
   performing a layer transfer of said second part of said SiGe relaxed buffer and said thin Si layer;
   etching away remainder of said first part of said SiGe relaxed buffer with a first selective etch, employing said thin Si layer as etch stop; and
   etching away said thin Si layer with a second selective etch, employing said second part of said SiGe relaxed buffer as etch stop, whereby exposing said second part of said SiGe relaxed buffer and using said second part of said SiGe relaxed buffer as said SiGe relaxed buffer layer.

26. The method of claim 25, wherein said securing step further comprises the step of enclosing at least one conducting plane in said insulating divider layer.

27. The method of claim 26, further comprising the step of patterning said at least one conducting plane.

28. The method of claim 26, further comprising the step of connecting said at least one conducting plane out of said insulating divider layer by means of at least one via.

29. The method of claim 25, wherein said securing step further comprises the steps of:
  growing epitaxially a between about 0.3 nm and 1.5 nm thick second crystalline $SiO_2$ layer onto said second part of said SiGe relaxed buffer; and
  depositing a first insulator layer over said second crystalline $SiO_2$ layer, wherein said interposed insulating divider layer comprises said second crystalline $SiO_2$ layer and said first insulator layer.

30. A method for creating a strained crystalline layer divided into two complementary regions, a first region consisting essentially of a tensilely strained SiGe layer, and a second region consisting essentially of a compressively strained SiGe layer, comprising the steps of:
  fabricating said tensilely strained SiGe layer;
  fabricating said compressively strained SiGe layer, wherein said compressively strained SiGe layer having essentially same thickness as said tensilely strained SiGe layer;
  removing said tensilely strained SiGe in places corresponding to said second region;
  removing said compressively strained SiGe layer in places corresponding to said first region; and
  bonding said tensilely strained SiGe layer and said compressively strained SiGe layer while interlocking said complementary first and second regions, whereby said tensilely strained SiGe layer and said compressively strained SiGe layer forming said strained crystalline layer divided into two complementary regions, and
  removing an excess of material covering said strained crystalline layer, whereby said excess of material resulted due to said bonding step.

31. The method of claim 30, further comprising the step of:
  constructing at least one isolation dielectric strip before said bonding step onto a sidewall surface of said strained crystalline layer, wherein said sidewall surface has become exposed after said removing steps, whereby said isolation dielectric strip facilitates alignment in said bonding step, and will become an isolating trench separating said compressively strained SiGe layer from said tensilely strained SiGe layer.

32. A method for fabricating a processor, comprising the step of:
  using at least one chip, wherein said at least one chip is selected to comprise a strained crystalline layer having a tensilely strained SiGe layer portion and a compressively strained SiGe layer portion, wherein creating said crystalline layer comprise the step of bonding epitaxially said strained crystalline layer over a SiGe relaxed buffer layer, wherein said tensilely strained SiGe and said compressively strained SiGe are epitaxially bonded over said SiGe relaxed buffer layer in coplanar spatial relation, wherein the Ge concentration of said tensilely strained SiGe is chosen to be below the Ge concentration of said SiGe relaxed buffer, and the Ge concentration of said compressively strained SiGe is chosen to be above the Ge concentration of said SiGe relaxed buffer, and wherein a plurality of devices are hosted in said strained crystalline layer, and wherein said plurality of devices are chosen to comprise electron conduction type devices in said tensilely strained SiGe portion, and wherein said plurality of devices are chosen to comprise hole conduction type devices in said compressively strained SiGe portion.

33. The method for fabricating the processor of claim 32, further comprise the step of incorporating into said at least one chip at least one optical device.

\* \* \* \* \*